US012805049B2

(12) United States Patent
Nakamura et al.

(10) Patent No.: US 12,805,049 B2
(45) Date of Patent: Nov. 17, 2026

(54) IMAGING ELEMENT AND IMAGING DEVICE

(71) Applicant: SONY SEMICONDUCTOR SOLUTIONS CORPORATION, Kanagawa (JP)

(72) Inventors: Yuta Nakamura, Kanagawa (JP); Nobutoshi Fujii, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 460 days.

(21) Appl. No.: 18/550,693

(22) PCT Filed: Feb. 28, 2022

(86) PCT No.: PCT/JP2022/008311

§ 371 (c)(1),
(2) Date: Sep. 15, 2023

(87) PCT Pub. No.: WO2022/202127

PCT Pub. Date: Sep. 29, 2022

(65) Prior Publication Data

US 2024/0162268 A1 May 16, 2024

(30) Foreign Application Priority Data

Mar. 23, 2021 (JP) ................................. 2021-048895

(51) Int. Cl.
*H10F 39/00* (2025.01)
*H10F 39/18* (2025.01)

(52) U.S. Cl.
CPC ........... *H10F 39/811* (2025.01); *H10F 39/18* (2025.01); *H10F 39/809* (2025.01)

(58) Field of Classification Search
CPC ....... H10F 39/811; H10F 39/18; H10F 39/809
See application file for complete search history.

(56) References Cited

U.S. PATENT DOCUMENTS

2021/0118935 A1* 4/2021 Haneda .................. H04N 25/70
2022/0353449 A1* 11/2022 Ito ........................ H04N 25/778

FOREIGN PATENT DOCUMENTS

JP 2015-028780 A 2/2015
JP 2018-092991 A 6/2018
(Continued)

OTHER PUBLICATIONS

International Search Report and Written Opinion of PCT Application No. PCT/JP2022/008311, issued on May 24, 2022, 08 pages of ISRWO.

*Primary Examiner* — Benjamin Tzu-Hung Liu
(74) *Attorney, Agent, or Firm* — CHIP LAW GROUP

(57) ABSTRACT

In an imaging element obtained by stacking a plurality of semiconductor substrates, connection between semiconductor substrates is facilitated. The imaging element includes a first semiconductor substrate, a second semiconductor substrate, an insulating layer, connection sections, and a recess. The first semiconductor substrate includes photoelectric conversion sections that perform photoelectric conversion of incident light. The second semiconductor substrate includes pixel circuits that generate an image signal corresponding to a charge generated by the photoelectric conversion, and the first semiconductor substrate is stacked on the back side of the second semiconductor substrate. The insulating layer is disposed between the first semiconductor substrate and the second semiconductor substrate. A connection section penetrates through the insulating layer and connects the first semiconductor substrate and the back side of the second semiconductor substrate. The recess is disposed on a surface of the insulating layer adjacent to the second semiconductor substrate and is formed around the connection sections.

16 Claims, 20 Drawing Sheets

(56) References Cited

FOREIGN PATENT DOCUMENTS

| | | | |
|---|---|---|---|
| JP | WO2020004065 | * | 1/2020 |
| JP | WO2020262320 | * | 12/2020 |
| WO | 2019/135333 | A1 | 7/2019 |
| WO | 2020/004065 | A1 | 1/2020 |
| WO | 2020/218503 | A1 | 10/2020 |

* cited by examiner

IMAGING ELEMENT AND IMAGING DEVICE

CROSS REFERENCE TO RELATED APPLICATIONS

This application is a U.S. National Phase of International Patent Application No. PCT/JP2022/008311 filed on Feb. 28, 2022, which claims priority benefit of Japanese Patent Application No. JP 2021-048895 filed in the Japan Patent Office on Mar. 23, 2021. Each of the above-referenced applications is hereby incorporated herein by reference in its entirety.

FIELD

The present disclosure relates to an imaging element and an imaging device.

BACKGROUND

For imaging elements that capture an image of a subject, imaging elements including a stack of a plurality of substrates are used. The plurality of substrates corresponds to, for example, a substrate in which a pixel for converting incident light from a subject into an image signal by using photoelectric conversion is formed and a substrate in which a circuit for generating a control signal of a pixel or a circuit for processing the image signal is formed. A circuit that handles an analog image signal is arranged in the pixel. Meanwhile, a digital circuit that operates at a high speed is mainly used for the circuit for processing the image signal. As described above, by arranging circuits having different characteristics on different substrates, it becomes possible to manufacture the substrates by applying optimum processes to these circuits. Furthermore, since these substrates are stacked, it is also possible to reduce the area of the imaging element.

For example, an imaging element is proposed in which a first semiconductor substrate in which a photoelectric conversion element that performs photoelectric conversion of incident light is disposed and a second semiconductor substrate in which an amplification transistor that amplifies a signal generated by the photoelectric conversion element is disposed are stacked to form a pixel (see, for example, Patent Literature 1). In this imaging element, the first semiconductor substrate and the second semiconductor substrate are stacked via an insulating film. The first semiconductor substrate and the second semiconductor substrate are connected by a contact embedded in the insulating film. The second semiconductor substrate has a low-resistance semiconductor region on a surface opposite to a surface on which the amplification transistor is disposed. The contact is bonded to the semiconductor region. By this contact, the ground potential of the first semiconductor substrate and the second semiconductor substrate is shared.

CITATION LIST

Patent Literature

Patent Literature 1: JP 2015-028780 A

SUMMARY

Technical Problem

However, the above technology of the related art has a problem that it is difficult to connect the contact (connection section) and the second semiconductor substrate. The insulating film is formed on the first semiconductor substrate. The connection section is disposed in a through hole formed in the insulating film. When the second semiconductor substrate is stacked on the insulating film in which the connection section is disposed, the connection section is connected in contact with the low-resistance semiconductor region of the second semiconductor substrate. However, since the height of the connection section varies, the bonding with the semiconductor region of the second semiconductor substrate upon stacking also varies. Therefore, there is a problem that it is difficult to connect the first semiconductor substrate and the second semiconductor substrate.

Therefore, the present disclosure proposes an imaging element and an imaging device that facilitates connection between semiconductor substrates, the imaging element and the imaging device including a stack of a plurality of semiconductor substrates.

Solution to Problem

An imaging element according to the present disclosure includes: a first semiconductor substrate including a photoelectric conversion section that performs photoelectric conversion of incident light; a second semiconductor substrate including a pixel circuit that generates an image signal corresponding to a charge generated by the photoelectric conversion, the second semiconductor substrate stacked with the first semiconductor substrate on a back side of the second semiconductor substrate; an insulating layer disposed between the first semiconductor substrate and the second semiconductor substrate; a connection section penetrating through the insulating layer and connecting the first semiconductor substrate and the back side of the second semiconductor substrate; and a recess disposed on a surface of the insulating layer adjacent to the second semiconductor substrate, the recess formed around the connection section.

DESCRIPTION OF EMBODIMENTS

Hereinafter, embodiments of the present disclosure will be described in detail on the basis of the drawings. Description will be given in the following order. Note that in each of the following embodiments, the same parts are denoted by the same symbols, and redundant description will be omitted.

1. First Embodiment
2. Second Embodiment
3. First Modification
4. Second Modification
5. Application Examples
6. Application Example to Mobile Body
7. Application Example to Endoscopic Surgery System

1. First Embodiment

[Functional Configuration of Imaging Device 1]

Figure 1:
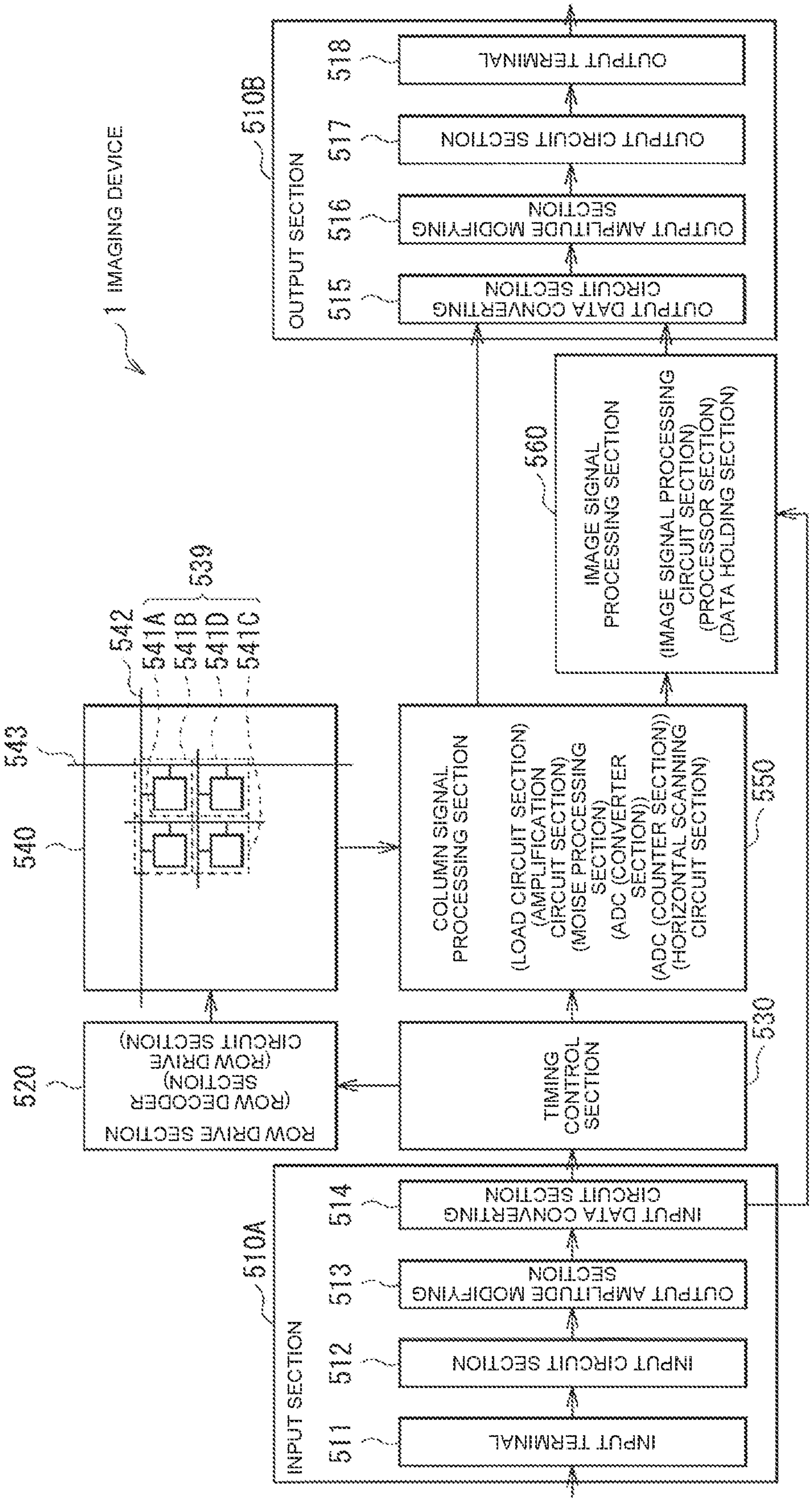
FIG. 1 is a block diagram illustrating an example of a functional configuration of an imaging device according to an embodiment of the present disclosure.

FIG. 1 is a block diagram illustrating an example of a functional configuration of an imaging device (imaging device 1) according to an embodiment of the present disclosure.

The imaging device 1 of FIG. 1 includes, for example, an input section 510A, a row drive section 520, a timing control section 530, a pixel array section 540, a column signal processing section 550, an image signal processing section 560, and an output section 510B.

In the pixel array section 540, pixels 541 are repeatedly arranged in an array. More specifically, a pixel sharing unit 539 including a plurality of pixels serves as a repeating unit and is repeatedly arranged in an array including a row direction and a column direction. Note that, in the present specification, for convenience, the row direction may be referred to as an H direction, and the column direction orthogonal to the row direction may be referred to as a V direction. In the example of FIG. 1, one pixel sharing unit 539 includes four pixels (pixels 541A, 541B, 541C, and 541D). Each of the pixels 541A, 541B, 541C, and 541D includes a photoelectric conversion section 101 (illustrated in FIG. 6 and others described later). The pixel sharing unit 539 is a unit that shares one pixel circuit (pixel circuit 210 in FIG. 3 described later). In other words, one pixel circuit (pixel circuit 210 described later) is provided for every four pixels (pixels 541A, 541B, 541C, and 541D). By operating pixel circuits in a time division manner, pixel signals of the respective pixels 541A, 541B, 541C, and 541D are sequentially read. The pixels 541A, 541B, 541C, and 541D are arranged in, for example, two rows×two columns. In the pixel array section 540, a plurality of row drive signal lines 542 and a plurality of vertical signal lines (column readout lines) 543 are included together with the pixels 541A, 541B, 541C, and 541D. A row drive signal line 542 drives pixels 541 included in each of a plurality of pixel sharing units 539 arranged side by side in the row direction in the pixel array section 540. In the pixel sharing unit 539, pixels arranged side by side in the row direction are driven. As will be described in detail later with reference to FIG. 4, a pixel sharing unit 539 includes a plurality of transistors. In order to drive each of the plurality of transistors, a plurality of row drive signal lines 542 are connected to one pixel sharing unit 539. A vertical signal line (column readout line) 543 is connected with pixel sharing units 539. A pixel signal is read from each of the pixels 541A, 541B, 541C, and 541D included in the pixel sharing unit 539 via a vertical signal line (column readout line) 543.

The row drive section 520 includes, for example, a row address control section that determines a position of a row for driving pixels, in other words, a row decoder section, and a row drive circuit section that generates signals for driving the pixels 541A, 541B, 541C, and 541D.

The column signal processing section 550 includes, for example, a load circuit section that is connected to the vertical signal lines 543 and forms a source follower circuit with the pixels 541A, 541B, 541C, and 541D (pixel sharing units 539). The column signal processing section 550 may include an amplification circuit section that amplifies signals read from a pixel sharing unit 539 via a vertical signal line 543. The column signal processing section 550 may include a noise processing section. In the noise processing section, for example, the noise level of the system is removed from the signals read from the pixel sharing unit 539 as a result of photoelectric conversion.

The column signal processing section 550 includes, for example, an analog-to-digital converter (ADC). In the analog-to-digital converter, a signal read from the pixel sharing unit 539 or an analog signal having been subjected to the noise processing is converted into a digital signal. The ADC includes, for example, a comparator section and a counter section. In the comparator section, an analog signal to be converted is compared with a reference signal to be compared to. In the counter section, the time until the comparison result in the comparator section is inverted is measured. The column signal processing section 550 may include a horizontal scanning circuit section that performs control of scanning a reading column.

The timing control section 530 supplies a signal for controlling timing to the row drive section 520 and the column signal processing section 550 on the basis of a reference clock signal or a timing control signal input to the device.

The image signal processing section 560 is a circuit that performs various types of signal processing on data obtained as a result of the photoelectric conversion, in other words, data obtained as a result of the imaging operation in the imaging device 1. The image signal processing section 560 includes, for example, an image signal processing circuit section and a data holding section. The image signal processing section 560 may include a processor section.

An example of signal processing executed in the image signal processing section 560 is tone curve correction processing of providing a large number of tones in a case where AD converted imaging data is data capturing an image of a dark subject and reducing the number of tones in a case where the AD converted imaging data is data capturing an image of a bright subject. In this case, it is desirable to store the characteristic data of the tone curve in the data holding section of the image signal processing section 560 in advance regarding based on what type of tone curve the tone of the imaging data is to be corrected.

The input section 510A is, for example, for inputting the reference clock signal, the timing control signal, the characteristic data, and others from the outside of the device to the imaging device 1. The timing control signal is, for example, a vertical synchronization signal, a horizontal synchronization signal, or the like. The characteristic data is, for example, to be stored in the data holding section of the image signal processing section 560. The input section 510A includes, for example, an input terminal 511, an input circuit section 512, an input amplitude modifying section 513, an input data converting circuit section 514, and a power supply section (not illustrated).

The input terminal 511 is an external terminal for inputting data. The input circuit section 512 is for ingesting a signal input to the input terminal 511 into the imaging device 1. In the input amplitude modifying section 513, the amplitude of the signal ingested by the input circuit section 512 is modified to an amplitude that can be easily used inside the imaging device 1. In the input data converting circuit section 514, the arrangement of data rows of input data is modified. The input data converting circuit section 514 includes, for example, a serial-parallel conversion circuit. In this serial-parallel conversion circuit, serial signals received as input data are converted into parallel signals. Note that, in the input section 510A, the input amplitude modifying section 513 and the input data converting circuit section 514 may be omitted. The power supply section supplies power set to various voltages required inside the imaging device 1 from the power supplied from the outside to the imaging device 1.

In a case where the imaging device 1 is connected to an external memory device, the input section 510A may include a memory interface circuit that receives data from the external memory device. Examples of the external memory device include a flash memory, an SRAM, a DRAM, and others.

The output section 510B outputs image data to the outside of the device. The image data is, for example, image data captured by the imaging device 1, image data having been subjected to signal processing by the image signal processing section 560, and the like. The output section 510B includes, for example, an output data converting circuit section 515, an output amplitude modifying section 516, an output circuit section 517, and an output terminal 518.

The output data converting circuit section 515 includes, for example, a parallel-serial conversion circuit, and in the output data converting circuit section 515, parallel signals used inside the imaging device 1 are converted into serial signals. The output amplitude modifying section 516 modifies the amplitude of a signal used inside the imaging device 1. The signal having the modified amplitude is facilitated for use in an external device connected externally to the imaging device 1. The output circuit section 517 outputs data from the inside of the imaging device 1 to the outside of the device, and wiring outside the imaging device 1 connected to the output terminal 518 is driven by the output circuit section 517. At the output terminal 518, data is output from the imaging device 1 to the outside of the device. In the output section 510B, the output data converting circuit section 515 and the output amplitude modifying section 516 may be omitted.

In a case where the imaging device 1 is connected to an external memory device, the output section 510B may include a memory interface circuit that outputs data to the external memory device. Examples of the external memory device include a flash memory, an SRAM, a DRAM, and others.

[Schematic Configuration of Imaging Device 1]

Figure 2:
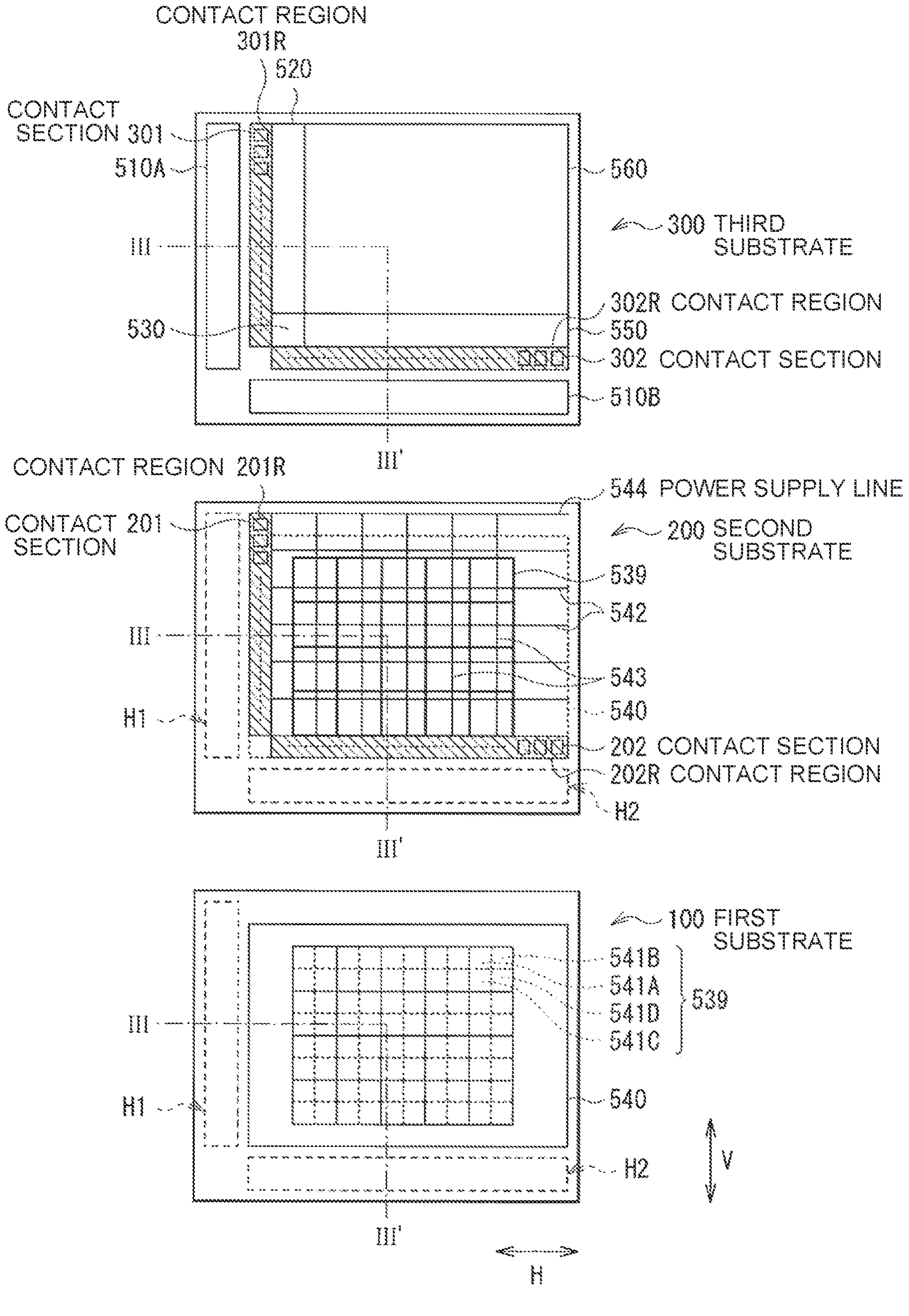
FIG. 2 is a schematic plan view illustrating a schematic configuration of the imaging device illustrated in FIG. 1.
Figure 3:
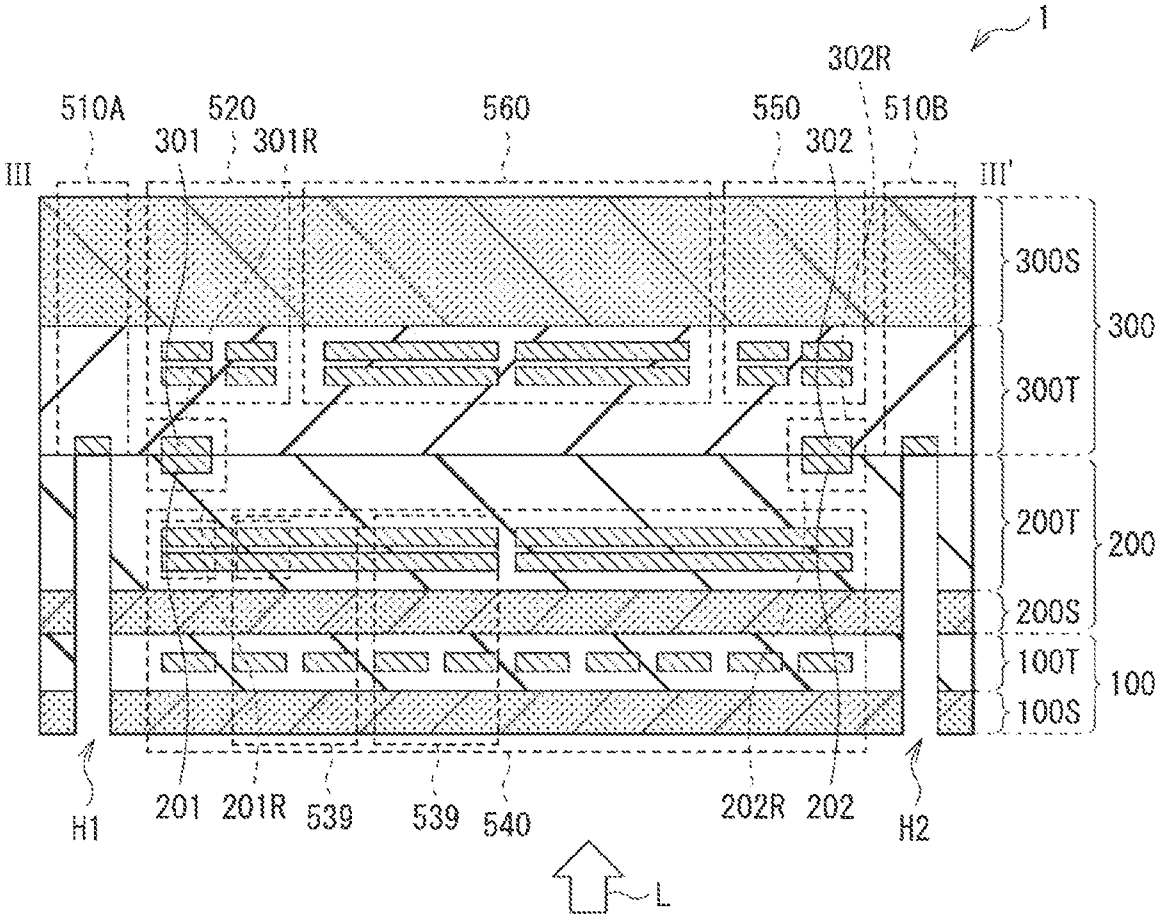
FIG. 3 is a schematic diagram illustrating a cross-sectional structure taken along line III-III' illustrated in FIG. 2.

FIGS. 2 and 3 are diagrams illustrating an example of a schematic configuration of the imaging device 1. The imaging device 1 includes three substrates (first substrate 100, second substrate 200, and third substrate 300). FIG. 2 is a diagram schematically illustrating a planar structure of each of the first substrate 100, the second substrate 200, and the third substrate 300, and FIG. 3 is a diagram schematically illustrating a cross-sectional structure of the first substrate 100, the second substrate 200, and the third substrate 300 stacked on each other. FIG. 3 corresponds to a cross-sectional structure taken along line III-III' illustrated in FIG. 2. The imaging device 1 has a three-dimensional structure obtained by bonding the three substrates (first substrate 100, second substrate 200, and third substrate 300). The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Herein, a combination of wiring included in each of the first substrate 100, the second substrate 200, and the third substrate 300 and an interlayer insulating film around the wiring is referred to as a wiring layer (100T, 200T, or 300T) included in each substrate (first substrate 100, second substrate 200, or third substrate 300) for convenience. The first substrate 100, the second substrate 200, and the third substrate 300 are stacked in the order mentioned, and the semiconductor layer 100S, the wiring layer 100T, the semiconductor layer 200S, the wiring layer 200T, the wiring layer 300T, and the semiconductor layer 300S are arranged in the order mentioned along the stacking direction. Specific structures of the first substrate 100, the second substrate 200, and the third substrate 300 will be described later. The arrow illustrated in FIG. 3 indicates the incident direction of light L on the imaging device 1. In the present specification, for convenience, in the following cross-sectional views, the light incident side of the imaging device 1 may be described as “down”, “lower side”, or “lower”, and the side opposite to the light incident side may be described as “up”, “upper side”, or “upper”. In addition, in the present specification, for convenience, in a substrate including a semiconductor layer and a wiring layer, a side of the wiring layer may be referred to as a front side, and a side of the semiconductor layer may be referred to as a back side. Note that the description of the specification is not limited to the above terms. The imaging device 1 is, for example, a back-illuminated imaging device in which light enters from the back side of the first substrate 100 having a photodiode.

Both the pixel array section 540 and the pixel sharing units 539 included in the pixel array section 540 are configured using both the first substrate 100 and the second substrate 200. The first substrate 100 includes a plurality of pixels 541A, 541B, 541C, and 541D included in the pixel sharing units 539. Each of these pixels 541 includes a photodiode (photoelectric conversion section 101 described later) and a transfer transistor (charge transfer section 102 described later). The second substrate 200 includes pixel circuits (pixel circuits 210 described later) included in the pixel sharing units 539. A pixel circuit reads a pixel signal transferred from a photodiode of each of pixels 541A, 541B, 541C, and 541D via a transfer transistor or resets the photodiode. In addition to such pixel circuits, the second substrate 200 includes a plurality of row drive signal lines 542 extending in the row direction and a plurality of vertical signal lines 543 extending in the column direction. The second substrate 200 further includes a power supply line 544 extending in the row direction. The third substrate 300 includes, for example, an input section 510A, a row drive section 520, a timing control section 530, a column signal processing section 550, an image signal processing section 560, and an output section 510B. The row drive section 520 is provided, for example, in a region where a part thereof overlaps the pixel array section 540 in the stacking direction of the first substrate 100, the second substrate 200, and the third substrate 300 (hereinafter, simply referred to as a stacking direction). More specifically, the row drive section 520 is provided in a region overlapping the vicinity of an end of the pixel array section 540 in the H direction in the stacking direction (FIG. 2). The column signal processing section 550 is provided, for example, in a region partially overlapping the pixel array section 540 in the stacking direction. More specifically, the column signal processing section 550 is provided in a region overlapping the vicinity of an end of the pixel array section 540 in the V direction in the stacking direction (FIG. 2). Although not illustrated, the input section 510A and the output section 510B may be disposed in a portion other than the third substrate 300, for example, may be disposed in the second substrate 200. Alternatively, the input section 510A and the output section 510B may be provided on the back (light incident surface) side of the first substrate 100. Note that a pixel circuit included in the second substrate 200 may be referred to as a pixel transistor circuit, a pixel transistor group, a pixel transistor, a pixel readout circuit, or a readout circuit as another name. In the present specification, the term “pixel circuit” is used.

The first substrate 100 and the second substrate 200 are electrically connected by, for example, through electrodes (through electrodes 252, 253A, and 253B in FIG. 6 described later). The second substrate 200 and the third substrate 300 are electrically connected via, for example, contact sections 201, 202, 301, and 302. The contact sections 201 and 202 are included in the second substrate 200, and contact sections 301 and 302 are included in the third substrate 300. A contact section 201 of the second substrate 200 is in contact with a contact section 301 of the third substrate 300, and a contact section 202 of the second substrate 200 is in contact with a contact section 302 of the third substrate 300. The second substrate 200 includes a contact region 201R in which a plurality of contact sections 201 is included and a contact region 202R in which a plurality of contact sections 202 is included. The third substrate 300 includes a contact region 301R in which a plurality of contact sections 301 is included and a contact region 302R in which a plurality of contact sections 302 is included. The contact regions 201R and 301R are included between the pixel array section 540 and the row drive section 520 in the stacking direction (FIG. 3). In other words, the contact regions 201R and 301R are included, for example, in a region where the row drive section 520 (third substrate 300) and the pixel array section 540 (second substrate 200) overlap in the stacking direction or in a vicinity region thereof. The contact regions 201R and 301R are arranged, for example, at ends in the H direction in such regions (FIG. 2). In the third substrate 300, for example, the contact region 301R is included at a position overlapping a part of the row drive section 520, specifically, an end of the row drive section 520 in the H direction (FIGS. 2 and 3). The contact sections 201 and 301 connect, for example, the row drive section 520 included in the third substrate 300 and the row drive signal lines 542 included in the second substrate 200. For example, the contact sections 201 and 301 may connect the input section 510A included in the third substrate 300 to the power supply line 544 and a reference potential line (grounding line described later). The contact regions 202R and 302R are included between the pixel array section 540 and the column signal processing section 550 in the stacking direction (FIG. 3). In other words, the contact regions 202R and 302R are included, for example, in a region where the column signal processing section 550 (third substrate 300) and the pixel array section 540 (second substrate 200) overlap in the stacking direction or in a vicinity region thereof. The contact regions 202R and 302R are arranged, for example, at ends in the V direction in such regions (FIG. 2). In the third substrate 300, for example, the contact region 301R is included at a position overlapping a part of the column signal processing section 550, specifically, an end of the column signal processing section 550 in the V direction (FIGS. 2 and 3). The contact sections 202 and 302 are, for example, for connecting pixel signals (signals corresponding to the amount of charges generated as a result of photoelectric conversion in the photodiodes) output from each of the plurality of pixel sharing units 539 included in the pixel array section 540 to the column signal processing section 550 included in the third substrate 300. The pixel signals are sent from the second substrate 200 to the third substrate 300.

FIG. 3 is an example of a cross-sectional view of the imaging device 1 as described above. The first substrate 100, the second substrate 200, and the third substrate 300 are electrically connected via the wiring layers 100T, 200T, and 300T. For example, the imaging device 1 includes electrical connection sections that electrically connect the second substrate 200 and the third substrate 300. Specifically, the contact sections 201, 202, 301, and 302 are formed of electrodes made of a conductive material. The conductive material is, for example, a metal material such as copper (Cu), aluminum (Al), or gold (Au). The contact regions 201R, 202R, 301R, and 302R electrically connect the second substrate 200 and the third substrate 300, for example, by directly bonding pieces of wiring formed as electrodes. This enables input and/or output of signals between the second substrate 200 and the third substrate 300.

The electrical connection sections that electrically connects the second substrate 200 and the third substrate 300 can be included at desired locations. For example, as described as the contact regions 201R, 202R, 301R, and 302R in FIG. 3, the contact regions may be included in a region overlapping the pixel array section 540 in the stacking direction. Alternatively, the electrical connection sections may be included in a region not overlapping the pixel array section 540 in the stacking direction. Specifically, the electrical connection sections may be included in a region overlapping a peripheral portion disposed outside the pixel array section 540 in the stacking direction.

The first substrate 100 and the second substrate 200 include, for example, connection holes H1 and H2. The connection holes H1 and H2 penetrate the first substrate 100 and the second substrate 200 (FIG. 3). The connection holes H1 and H2 are included outside the pixel array section 540 (or a portion overlapping the pixel array section 540) (FIG. 2). For example, the connection hole H1 is disposed outside the pixel array section 540 in the H direction, and the connection hole H2 is disposed outside the pixel array section 540 in the V direction. For example, the connection hole H1 reaches the input section 510A included in the third substrate 300, and the connection hole H2 reaches the output section 510B included in the third substrate 300. The connection holes H1 and H2 may be hollow or may include a conductive material at least at a part thereof. For example, there is a configuration in which a bonding wire is connected to an electrode formed as the input section 510A and/or the output section 510B. There is another configuration in which the electrode formed as the input section 510A and/or the output section 510B is connected to the conductive material included in the connection holes H1 and H2. The conductive material included in the connection holes H1 and H2 may be embedded in a part or all of the connection holes H1 and H2, and the conductive material may be formed on side walls of the connection holes H1 and H2.

Note that, in FIG. 3, the input section 510A and the output section 510B are included in the third substrate 300, however, it is not limited thereto. For example, by sending a signal of the third substrate 300 to the second substrate 200 via the wiring layers 200T and 300T, the input section 510A and/or the output section 510B can be included in the second substrate 200. Similarly, by sending a signal of the second substrate 200 to the first substrate 1000 via the wiring layers 100T and 200T, the input section 510A and/or the output section 510B can be included in the first substrate 100.

Note that the imaging device 1 and the pixel array section 540 are an example of the imaging element described in the claims. The column signal processing section 550 is an example of a processing circuit described in the claims.

Figure 4:
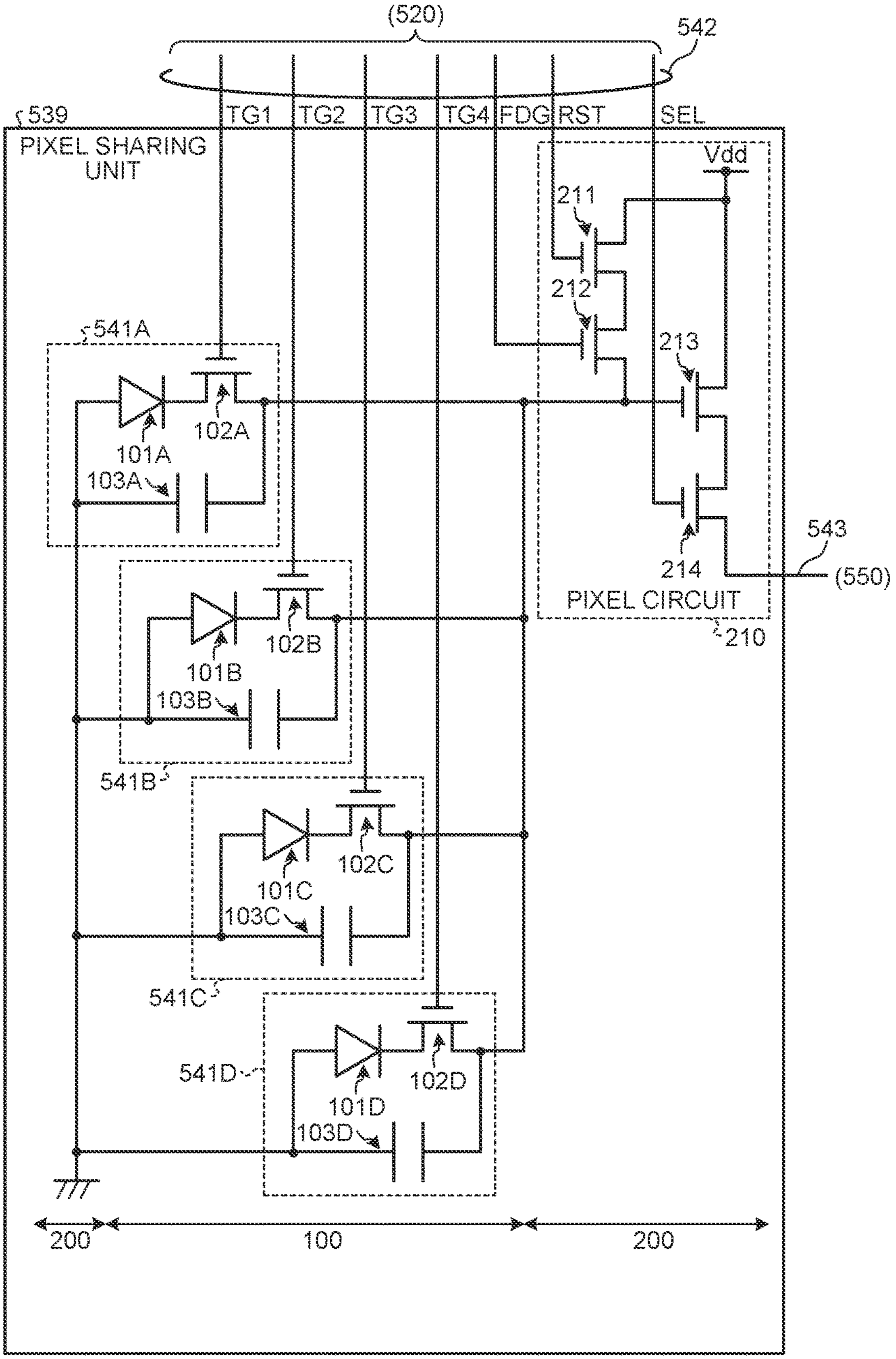
FIG. 4 is an equivalent circuit diagram illustrating an example of a configuration of a pixel sharing unit according to an embodiment of the present disclosure.

FIG. 4 is an equivalent circuit diagram illustrating an example of a configuration of a pixel sharing unit. A pixel sharing unit 539 includes a plurality of pixels 541 (in FIG. 4, four pixels 541 of pixels 541A, 541B, 541C, and 541D), one pixel circuit 210 connected to the plurality of pixels 541, and a vertical signal line 543 connected to the pixel circuit 210. The pixel circuit 210 includes, for example, four transistors, specifically, an amplification transistor 213, a selection transistor 214, a reset transistor 211, and a capacitance switching transistor 212. As described above, the pixel sharing unit 539 sequentially outputs pixel signals of the respective four pixels 541 (pixels 541A, 541B, 541C, and 541D) included in the pixel sharing unit 539 to the vertical signal line 543 by operating the one pixel circuit 210 in a time division manner. An aspect in which the one pixel circuit 210 is connected to the plurality of pixels 541 and the pixel signals of the plurality of pixels 541 are output by the one pixel circuit 210 in a time division manner is referred to as "the plurality of pixels 541 sharing the one pixel circuit 210".

The pixels 541A, 541B, 541C, and 541D have common components.

The pixels 541A, 541B, 541C, and 541D each include, for example, a photoelectric conversion section 101, a charge transfer section 102 electrically connected to the photoelectric conversion section 101, and a charge holding section 103 electrically connected to the charge transfer section 102. In the photoelectric conversion sections 101 (photoelectric conversion sections 101A, 101B, 101C, and 101D), a cathode is electrically connected to a source of the charge transfer section 102, and an anode is electrically connected to a reference potential line (for example, a grounding line). The photoelectric conversion sections 101 photoelectrically convert incident light and generates a charge corresponding to the amount of received light. The charge transfer sections 102 (charge transfer sections 102A, 102B, 102C, and 102D) are, for example, an n-channel MOS transistor. In the charge transfer sections 102, a drain is electrically connected to the charge holding section 103, and a gate is electrically connected to a drive signal line (signal line TG1, TG2, TG3, or TG4). The drive signal lines are a part of the plurality of row drive signal lines 542 (see FIG. 1) connected to the one pixel sharing unit 539. A charge transfer section 102 transfers a charge generated in the photoelectric conversion section 101 to the charge holding section 103. The charge holding sections 103 (charge holding sections 103A, 103B, 103C, and 103D) are an n-type diffusion layer region formed in a p-type semiconductor layer. Such a charge holding section 103 is referred to as floating diffusion (FD). The charge holding section 103 is a charge holding means that temporarily holds a charge transferred from the photoelectric conversion section 101 and is a charge-voltage converting means that generates a voltage corresponding to the charge amount.

The four charge holding sections 103 (charge holding sections 103A, 103B, 103C, and 103D) included in the one pixel sharing unit 539 are electrically connected to each other and are electrically connected to a gate of the amplification transistor 213 and a source of the capacitance switching transistor 212. A drain of the capacitance switching transistor 212 is connected to a source of the reset transistor 211, and a gate of the capacitance switching transistor 212 is connected to a drive signal line FDG. The drive signal line FDG is a part of the plurality of row drive signal lines 542 connected to the one pixel sharing unit 539. A drain of the reset transistor 211 is connected to a power supply line Vdd, and a gate of the reset transistor 211 is connected to a drive signal line RST. The drive signal line RST is a part of the plurality of row drive signal lines 542 connected to the one pixel sharing unit 539. The gate of the amplification transistor 213 is connected to the charge holding section 103, a drain of the amplification transistor 213 is connected to the power supply line Vdd, and a source of the amplification transistor 213 is connected to a drain of the selection transistor 214. A source of the selection transistor 214 is connected to the vertical signal line 543, and a gate of the selection transistor 214 is connected to a drive signal line SEL. The drive signal line SEL is a part of the plurality of row drive signal lines 542 connected to the one pixel sharing unit 539.

When a charge transfer section 102 is turned on, the charge transfer section 102 transfers the charge of the photoelectric conversion section 101 to the charge holding section 103. A gate (transfer gate) of the charge transfer section 102 includes, for example, a so-called vertical electrode and extends from a front side of a semiconductor layer (semiconductor layer 100S in FIG. 6 described later) to a point as deep as the photoelectric conversion section 101 as illustrated in FIG. 6 described later. The reset transistor 211 resets the potential of the charge holding sections 103 to a predetermined potential. When the reset transistor 211 is turned on, the potentials of the charge holding sections 103 are reset to the potential of the power supply line Vdd. The selection transistor 214 controls output timing of pixel signals from the pixel circuit 210. The amplification transistor 213 generates a signal of a voltage corresponding to the level of the charge held in a charge holding section 103 as a pixel signal. The amplification transistor 213 is connected to the vertical signal line 543 via the selection transistor 214. The amplification transistor 213 is included in a source follower together with the load circuit section (see FIG. 1) connected to the vertical signal line 543 in the column signal processing section 550. When the selection transistor 214 is turned on, the amplification transistor 213 outputs the voltages of the charge holding sections 103 to the column signal processing section 550 via the vertical signal line 543. The reset transistor 211, the amplification transistor 213, and the selection transistor 214 are, for example, n-channel MOS transistors.

The capacitance switching transistor 212 is used to change a gain of charge-voltage conversion in the charge holding sections 103. In general, a pixel signal is small at the time of photographing in a dark place. If the capacitance of a charge holding section 103 (capacitance C of the FD) is large at the time of performing charge-voltage conversion on the basis of Q=CV, V at the time of conversion into a voltage by the amplification transistor 213 becomes small. On the other hand, a pixel signal becomes large in a bright place, and thus a charge holding section 103 cannot fully receive the charge of the photoelectric conversion section 101 unless the capacitance C of the FD is large. Furthermore, the capacitance C of the FD needs to be large so that V obtained as a result of conversion into the voltage at the amplification transistor 213 is not too large (in other words, so as to be small). In view of these, when the capacitance switching transistor 212 is turned on, the gate capacitance for the capacitance switching transistor 212 increases, and thus the capacitance C of the FDs as a whole increases. On the other hand, when the capacitance switching transistor 212 is turned off, the capacitance C of the FDs as a whole decreases. As described above, by switching the capacitance switching transistor 212 on and off, the capacitance C of the FDs can be made variable, and the conversion efficiency can be switched. The capacitance switching transistor 212 is, for example, an n-channel MOS transistor.

Note that it is possible not to include the capacitance switching transistor 212. In this example, for example, the pixel circuit 210 includes three transistors such as the amplification transistor 213, the selection transistor 214, and the reset transistor 211. The pixel circuit 210 includes, for example, at least one of pixel transistors such as the amplification transistor 213, the selection transistor 214, the reset transistor 211, and the capacitance switching transistor 212.

The selection transistor 214 may be provided between the power supply line Vdd and the amplification transistor 213. In this case, the drain of the reset transistor 211 is electrically connected to the power supply line Vdd and the drain of the selection transistor 214. The source of the selection transistor 214 is electrically connected to the drain of the amplification transistor 213, and the gate of the selection transistor 214 is electrically connected to the row drive signal line 542 (see FIG. 1). The source of the amplification transistor 213 (output end of the pixel circuit 210) is electrically connected to the vertical signal line 543, and the gate of the amplification transistor 213 is electrically connected to the source of the reset transistor 211. Note that, although not illustrated, the number of pixels 541 sharing the one pixel circuit 210 may be other than four. For example, two or eight pixels 541 may share the one pixel circuit 210.

[Configuration of Pixel]

Figure 5:
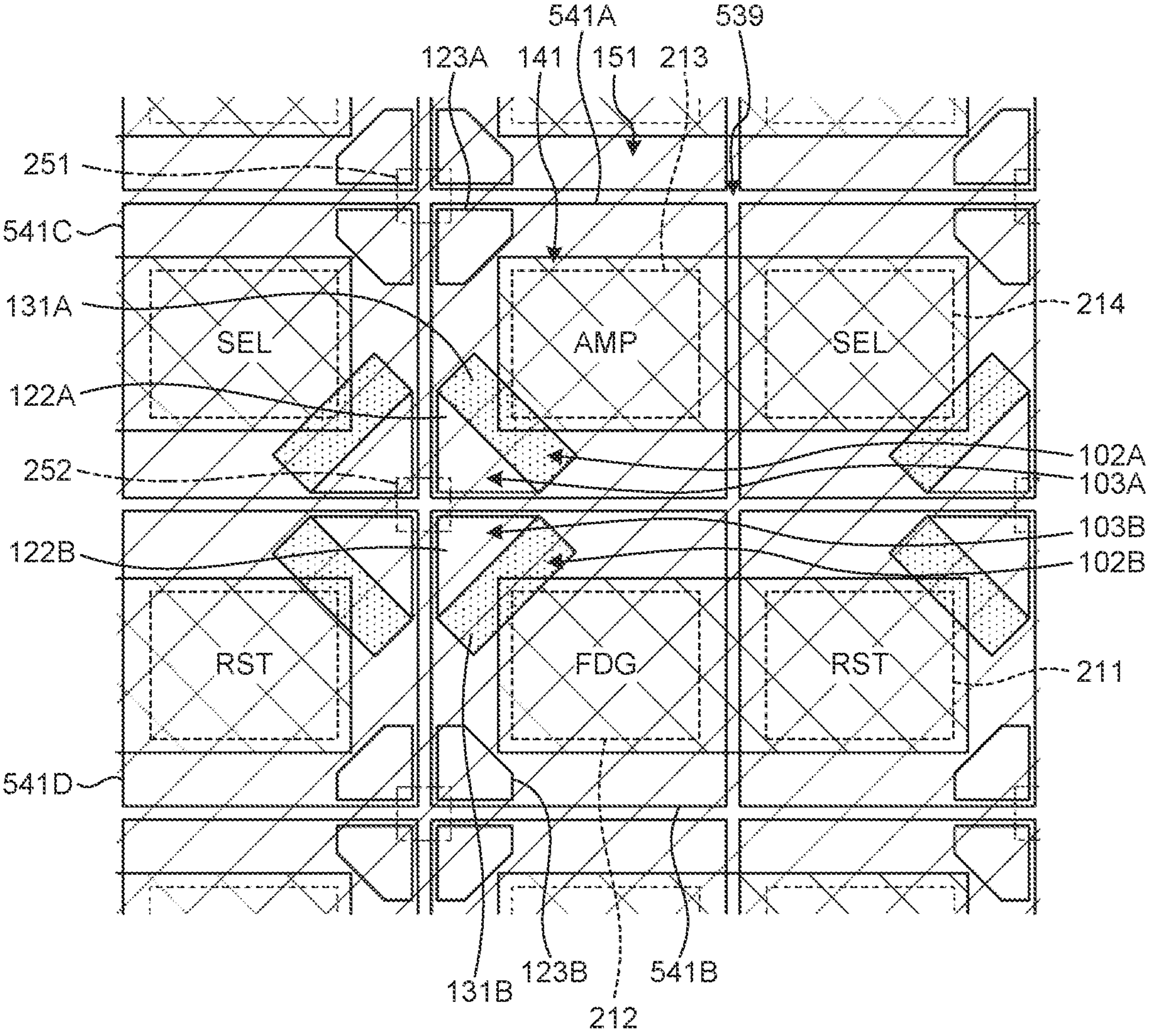
FIG. 5 is a diagram illustrating a structure example of pixels according to a first embodiment of the disclosure.

FIG. 5 is a diagram illustrating a structure example of pixels according to the first embodiment of the disclosure. The drawing is a plan view illustrating a structure example of the pixels (pixels 541A, 541B, 541C, and 541D) included in the pixel sharing unit 539. In addition, the drawing illustrates the structure of the first substrate 100 and the second substrate 200 viewed from the side of the second substrate 200.

In the drawing, a white region represents a semiconductor region formed in the first semiconductor substrate 120. Meanwhile, a dot-hatched region represents a gate electrode (such as a gate electrode 131A) of a MOS transistor arranged in the first semiconductor substrate 120. In addition, a cross-hatched region represents a region of the insulating layer (insulating layer 141) of the first semiconductor substrate 120, and an obliquely-hatched region represents a region of a recess (recess 151) formed in the insulating layer 141. In addition, a rectangle of an alternate long and short dash line represents a connection section (connection section 251) that connects a well region of the first semiconductor substrate 120 and a well region of the second semiconductor substrate 220. Moreover, a rectangle with a two-dot chain line represents a through electrode (through electrode 252). Furthermore, dotted rectangles represent regions of the reset transistor 211, the capacitance switching transistor 212, the amplification transistor 213, and the selection transistor 214 arranged in the second semiconductor substrate 220. Note that "RST", "FDG", "AMP", and "SEL" in the drawing represent the reset transistor 211, the capacitance switching transistor 212, the amplification transistor 213, and the selection transistor 214, respectively.

As described above, the pixels 541A, 541B, 541C, and 541D are arranged in the first substrate 100. As illustrated in the drawing, the pixels 541A, 541B, 541C, and 541D are arranged in two rows and two columns. The charge holding sections 103A, 103B, 103C, and 103D are arranged in the vicinity of the center of these. The charge transfer sections 102A, 102B, 102C, and 102D are arranged adjacent to the charge holding sections 103A, 103B, 103C, and 103D, respectively. For convenience, illustration of 102C, 102D, 103C, and 103D are omitted in the drawing.

The pixel circuit 210 is disposed in the second substrate 200. The reset transistor 211 and the capacitance switching transistor 212 of the pixel circuit 210 are arranged adjacent to each other, and the amplification transistor 213 and the selection transistor 214 are arranged adjacent to each other. In addition, the reset transistor 211 and the capacitance switching transistor 212, and the amplification transistor 213 and the selection transistor 214 are arranged separately from each other.

A recess 151 is disposed in the insulating layer 141. Illustrated is an example in which the recess 151 in the drawing is formed in a region different from a region immediately below the elements (reset transistor 211, capacitance switching transistor 212, amplification transistor 213, and selection transistor 214) in the second semiconductor substrate 220. Details of the structure of the recess 151 of the insulating layer 141 will be described later.

[Structure of Cross-Section of Imaging Device]

Figure 6:
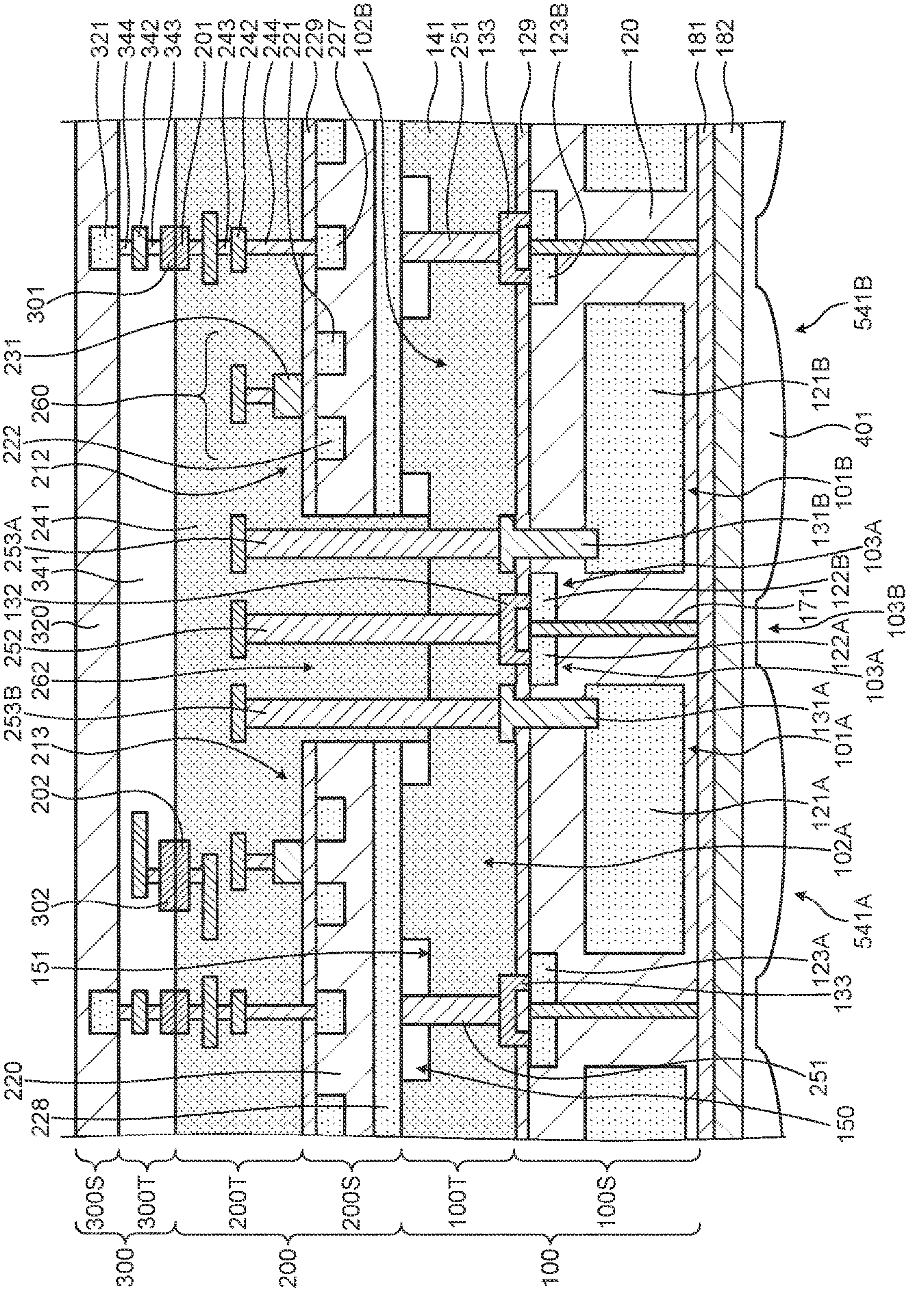
FIG. 6 is a cross-sectional view illustrating a structure example of the imaging device according to the first embodiment of the disclosure.

FIG. 6 is a cross-sectional view illustrating a structure example of the imaging device according to the first embodiment of the disclosure. The drawing is a cross-sectional view illustrating the structure example of the imaging device 1. The imaging device 1 in the drawing includes the first substrate 100, the second substrate 200, and the third substrate 300. As described above, the first substrate 100 includes the semiconductor layer 100S and the wiring layer 100T, the second substrate 200 includes the semiconductor layer 200S and the wiring layer 200T, and the third substrate 300 includes the semiconductor layer 300S and the wiring layer 300T. The imaging device 1 further includes an insulating film 181, color filters 182, and on-chip lenses 401.

The semiconductor layer 100S includes the first semiconductor substrate 120, an insulating film 129, and isolation sections 171.

The first semiconductor substrate 120 is a semiconductor substrate in which the photoelectric conversion sections 101 are arranged. The charge transfer sections 102 and the charge holding sections 103 are further arranged in the first semiconductor substrate 120 in the drawing. In the drawing, the photoelectric conversion sections 101A and 101B, the charge transfer sections 102A and 102B, and the charge holding sections 103A and 103B are illustrated. The first semiconductor substrate 120 can be made of silicon (Si), for example. A photoelectric conversion section 101 and the like is disposed in a well region formed in the first semiconductor substrate 120. For convenience, it is based on the premise that the first semiconductor substrate 120 in the drawing includes p-type well regions. An element (diffusion layer thereof) can be formed by disposing an n-type semiconductor region in the p-type well region.

A rectangle illustrated in the first semiconductor substrate 120 in the drawing represents an n-type semiconductor region. The photoelectric conversion section 101A includes an n-type semiconductor region 121A. Specifically, a photodiode including a p-n junction formed at an interface between the n-type semiconductor region 121A and the surrounding p-type well region corresponds to the photoelectric conversion section 101A. As illustrated in the drawing, the photoelectric conversion section 101A is formed closer to the back side of the first semiconductor substrate 120. The photoelectric conversion section 101B is configured similarly to the photoelectric conversion section 101A.

The charge holding sections 103A and 103B are configured by n-type semiconductor regions 122A and 122B, respectively. These n-type semiconductor regions 122A and 122B are included in the above-described FDs.

The charge transfer section 102A includes the semiconductor regions 121A and 122A and the gate electrode 131A. The n-type semiconductor regions 121A and 122A correspond to the source region and the drain region of the charge transfer section 102A. As illustrated in the drawing, the n-type semiconductor region 121A is formed closer to the back side of the first semiconductor substrate 120, and the n-type semiconductor region 122A is formed on a surface of the front side of the first semiconductor substrate 120. The gate electrode 131A is disposed on the front side of the first semiconductor substrate 120 and includes a columnar portion and having a depth reaching the n-type semiconductor region 121A. When a drive voltage is applied to the gate electrode 131A, a channel is formed in a well region adjacent to the gate electrode 131A, and the n-type semiconductor regions 121A and 122A are brought into a conductive state. That is, conduction is established between the photoelectric conversion section 101A and the charge holding section 103A, and the charge of the photoelectric conversion section 101A is transferred to the charge holding section 103A. As described above, the charge transfer section 102A includes a vertical transistor that transfers a charge in the thickness direction of the semiconductor substrate.

Similarly to the charge transfer section 102A, the charge transfer section 102B includes semiconductor regions 121B and 122B and a gate electrode 131B. Note that the gate electrodes 131A and 131B can be made of polycrystalline silicon doped with an impurity.

Note that semiconductor regions 123A and 123B are arranged in the first semiconductor substrate 120. The semiconductor regions 123A and 123B are arranged in the well regions of the first semiconductor substrate 120 and have the same conductivity type as that of the well regions and a relatively high impurity concentration.

The insulating film 129 insulates the front side of the first semiconductor substrate 120. The insulating film 129 can be made of silicon oxide ($SiO_2$) or a composite film of $SiO_2$ and silicon nitride (SiN). Note that the insulating film 129 is also disposed between the first semiconductor substrate 120 and the gate electrodes 131A and 131B. The insulating film 129 corresponds to a gate insulating film. An $SiO_2$ film can be formed by thermal oxidation.

An isolation section 171 is disposed at a boundary of pixels 541 to separate the pixels 541. In the drawing, an example in which the pixels 541A and 541B are separated by an isolation section 171 is illustrated. The isolation section 171 can be formed by embedding an insulator such as $SiO_2$ in a groove penetrating from the back side to the front side of the first semiconductor substrate 120.

The wiring layer 100T includes the insulating layer 141, pads 132 and 133, and connection sections 251. The insulating layer 141 insulates the gate electrodes 131, the pad 132, and others arranged on the front side of the first semiconductor substrate 120. The insulating layer 141 can be made of, for example, $SiO_2$. The pads 132 and 133 are electrodes connected to the semiconductor region of the first semiconductor substrate 120. The pad 132 is connected to the charge holding sections 103A and 103B and the charge holding sections 103C and 103D (not illustrated). A through electrode 252 described later is further connected to the pad 132. A pad 133 is connected to each of the semiconductor regions 123A and 123B and semiconductor regions 123 of the pixels 541C and 541 (not illustrated). A connection section 251 is further connected to the pad 133. The pads 132 and 133 can be made of polycrystalline silicon doped with an impurity.

Note that the recess 151 is disposed in the insulating layer 141. The recess 151 is formed on the front side of the insulating layer 141 adjacent to the second semiconductor substrate 220. The recess 151 is formed around connection sections 251 described later. The recess 151 and a surface of the back side of the second semiconductor substrate 220 form a gap 150. This gap 150 can be a vacuum. Details of the structure of the recess 151 will be described later.

The connection section 251 connects the first semiconductor substrate 120 and the second semiconductor substrate 220 in order to make a reference potential (well potential) common to the first semiconductor substrate 120 and the second semiconductor substrate 220. The connection section 251 in the drawing connects the semiconductor region 123 and a semiconductor region 228 described later via the pad 133. The connection section 251 can be made of polycrystalline silicon doped with an impurity. Note that the connection section 251 is also referred to as a well contact. As described later, a ground potential can be adopted as the reference potential. Incidentally, a fixed potential other than the ground potential can be adopted as the reference potential.

The semiconductor layer 200S includes the second semiconductor substrate 220 and an insulating film 229.

The second semiconductor substrate 220 is a substrate made of a semiconductor in which the pixel circuits 210 are arranged. In the second semiconductor substrate 220 in the drawing, the capacitance switching transistor 212 and the amplification transistor 213 of the pixel circuit 210 are illustrated. Similarly to the first semiconductor substrate 120, the second semiconductor substrate 220 can be made of Si. In addition, similarly to the first semiconductor substrate 120, a p-type well region is formed in the second semiconductor substrate 220. For convenience, it is based on the premise that the second semiconductor substrate 220 in the drawing includes p-type well regions.

The capacitance switching transistor 212 includes n-type semiconductor regions 221 and 222 and a gate electrode 231. Either one of the n-type semiconductor regions 221 and 222 serves as a source region, and the other serves as a drain region. A channel is formed in the well region immediately below the gate electrode 231 between the n-type semiconductor regions 221 and 222. Note that the amplification transistor 213 can also adopt a similar structure. Incidentally, a region of the second semiconductor substrate 220 where an element such as the capacitance switching transistor 212 or the amplification transistor 213 is formed is referred to as an element region 260.

A semiconductor region 227 is further disposed in the well region of the second semiconductor substrate 220. The semiconductor region 227 has a high impurity concentration and the same conductivity type as that of the well region. A connection section (contact plug 244) for supplying a well potential is connected to the semiconductor region 227.

In addition, a substrate isolation region 262 is disposed in the second semiconductor substrate 220. The substrate isolation region 262 is an isolation region formed by removing the second semiconductor substrate 220. Note that, in the substrate isolation region 262, an insulating layer 241 described later is disposed.

The semiconductor region 228 in the drawing is disposed at the bottom of the second semiconductor substrate 220 and has a relatively high impurity concentration and the same conductivity type as that of the well region of the second semiconductor substrate 220. By disposing the semiconductor region 228, the connection resistance with the connection section 251 can be reduced.

The insulating film 229 insulates the front side of the second semiconductor substrate 220. Similarly to the insulating film 129, the insulating film 229 can be made of $SiO_2$ or a composite film of $SiO_2$ and SiN. Incidentally, the $SiO_2$ film can be formed by thermal oxidation. This thermal oxidation is referred to as a high temperature process.

The wiring layer 200T includes the insulating layer 241, wiring 242, a via plug 243, a contact plug 244, through electrodes 252, 253A, and 253B, and contact sections 201 and 202. The wiring 242 is a conductor that transmits an electric signal or the like to an element or the like disposed in the second semiconductor substrate 220. The wiring 242 can be made of metal such as copper (Cu). The insulating layer 241 insulates the wiring 242 and others. Similarly to the insulating layer 141, the insulating layer 241 can be made of $SiO_2$ or the like. The wiring 242 and the insulating layer 241 can be multiple layers. In the drawing, the wiring 242 and the insulating layer 241 in two layers are illustrated as an example. Pieces of the wiring 242 arranged in different layers can be connected by the via plug 243. The via plug 243 can be made of a metal having a columnar shape, for example, Cu of a columnar shape. In addition, the wiring 242 and the semiconductor region 222, the gate electrode 231, and others of the second semiconductor substrate 220 can be connected by a contact plug 244. The contact plug 244 can be made of a metal having a columnar shape, for example, tungsten (W) of a columnar shape.

The through electrode 252 and the like are columnar electrodes that connect the wiring 242 and a member disposed on the front side of the first semiconductor substrate 120. The through electrode 252 is connected to the pad 132. The through electrodes 253A and 253B are connected to the gate electrodes 131A and 131B, respectively. These through electrodes 252 and the like can be made of metal such as W and can be disposed in the substrate isolation region 262.

As described above, the contact sections 201 and 202 are connected to the contact sections 301 and 303 of the third substrate 300, respectively. The contact section 201 is connected to the well region of the second semiconductor substrate 220 via the contact plug 244 and transmits the reference potential. The contact section 202 is used to transmit signals and the like.

The semiconductor layer 300S includes the third semiconductor substrate 320. The above-described image signal processing section 560 (not illustrated) and others are arranged in the third semiconductor substrate 320. In addition, a well region is formed in the third semiconductor substrate 320. A semiconductor region 321 is disposed in this well region. Similarly to the semiconductor region 123, the semiconductor region 321 has a relatively high impurity concentration and is connected with the contact plug 344.

The wiring layer 300T includes an insulating layer 341, wiring 342, a via plug 343, a contact plug 344, and contact sections 301 and 302. Since these structures are similar to those of the insulating layer 241, the wiring 242, the via plug 243, the contact plug 244, and the contact sections 301 and 302, the description thereof will be omitted.

As illustrated in the drawing, the semiconductor region 227 is connected to the semiconductor region 321 of the third semiconductor substrate 320 via the contact plug 244, the wiring 242, the via plug 243, the contact section 201, the contact section 301, the via plug 343, the wiring 342, and the contact plug 344. As a result, the well region of the second semiconductor substrate 220 and the well region of the third semiconductor substrate 320 are electrically connected, and the reference potential becomes common. For example, a ground potential of a power supply circuit connected to the third semiconductor substrate 320 can be adopted as the reference potential. Incidentally, a fixed potential other than the ground potential can be adopted as the reference potential. In this manner, the reference potential is supplied to the second semiconductor substrate 220 via the contact plug 244 and others.

The insulating film 181 insulates and protects the back side of the first semiconductor substrate 120. The insulating film 181 can be made of, for example, $SiO_2$. A color filter 182 is an optical filter that is disposed for each pixel 541 and transmits light having a predetermined wavelength among the incident light. An on-chip lens 401 is disposed for each pixel 541 and condenses incident light on a photoelectric conversion section 101.

[Structure of Recess]

Figure 7:
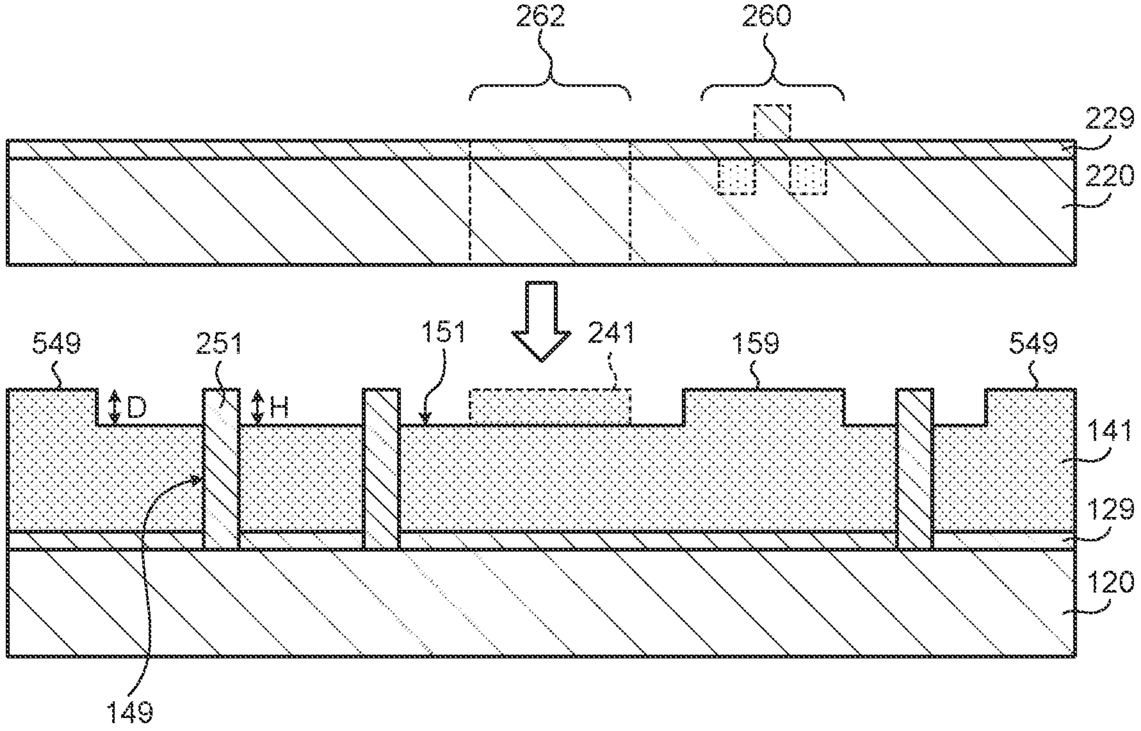
FIG. 7 is a diagram illustrating a structure example of a recess according to the first embodiment of the disclosure.

FIG. 7 is a diagram illustrating a structure example of a recess according to the first embodiment of the disclosure. The drawing is a cross-sectional view illustrating the structure example of a recess 151. This drawing illustrates the first semiconductor substrate 120 and the second semiconductor substrate 220 before stacking. An arrow in the drawing indicates a state in which the second semiconductor substrate 220 is stacked on the first semiconductor substrate 120 having a wafer shape in the manufacturing process of the imaging device 1.

The connection section 251 can be formed by disposing a conductive member such as polycrystalline silicon in an opening 149 formed in the insulating layer 141. The recess 151 can be formed by removing a surface of the insulating layer 141 around the connection section 251.

The recess 151 is formed around the connection section 251 on the front side of the insulating layer 141. The recess 151 can be further formed in a region other than a peripheral edge 549 of the pixel array section 540. Note that, for example, a region adjacent to an end of the first semiconductor substrate 120 corresponds to the peripheral edge 549. By disposing the recess 151 on the front side of the insulating layer 141, the connection section 251 can be made to protrude from the front side of the insulating layer 141. When the second semiconductor substrate 220 is stacked on the first semiconductor substrate 120, the tip of the connection section 251 can be brought into contact with the back side of the second semiconductor substrate 220 in the recess 151 before the surface of the insulating layer 141 (bottom surface of the recess 151) is. The occurrence of a connection failure between the connection section 251 and the back side of the second semiconductor substrate 220 can be reduced.

In addition, by disposing the recess 151, the above-described gap 150 can be formed after the first semiconductor substrate 120 and the second semiconductor substrate 220 are stacked. Since the gap 150 has a dielectric constant lower than that of $SiO_2$ constituting the insulating layer 141, the parasitic capacitance of the wiring such as the connection section 251 can be reduced.

Moreover, the recess 151 can be disposed in the insulating layer 141 in a region excluding a region 159 that is immediately below the element region 260 after stacking with the second semiconductor substrate 220. Since the recess 151 is not formed immediately below elements of the second semiconductor substrate 220, whereby a decrease in the strength of the elements can be prevented.

In addition, the recess 151 on the right side in the drawing represents an example of the recess 151 formed around one connection section 251. Meanwhile, the recess 151 on the left side in the drawing illustrates an example of the recess 151 formed in common around a plurality of connection sections 251. By adopting the structure in which the recess 151 includes a plurality of connection sections 251, the recess 151 can be disposed in a relatively wide area.

The recess 151 can be formed to have a depth, for example, deeper than or equal to 5 nm ("D" in the drawing). This makes it possible to secure a margin for variations in the manufacturing process. Furthermore, the height ("H" in the drawing) of the connection section 251 from the bottom surface of the recess 151 can be, for example, greater than or equal to 5 nm. This makes it possible to secure a margin for variations in the height of the connection section 251. Note that even in a case where the height H of the connection section 251 is smaller than the depth D of the recess 151 ($H<D$) in the drawing, the connection section 251 and the second semiconductor substrate 220 can be connected. This is because, as will be described later with reference to FIG. 8H, the second semiconductor substrate 220 is pressed against the front side of the insulating layer 141 when the second semiconductor substrate 220 is stacked. The second semiconductor substrate 220 is curved by this pressing, whereby the second semiconductor substrate 220 can be brought into contact with the end of the connection section 251.

Note that the insulating layer 241 is disposed in the recess 151 immediately below the substrate isolation region 262 of the second semiconductor substrate 220 in a step after the second semiconductor substrate 220 is stacked.

[Manufacturing Method of Imaging Device]

FIGS. 8A, 8B, 8C, 8D, 8E, 8F, 8G, 8H, 8I, 8J, 8K, and 8L are diagrams illustrating an example of a manufacturing method of the imaging device according to the first embodiment of the disclosure. The drawings illustrate an example of manufacturing steps of the imaging device 1.

Figure 8A:
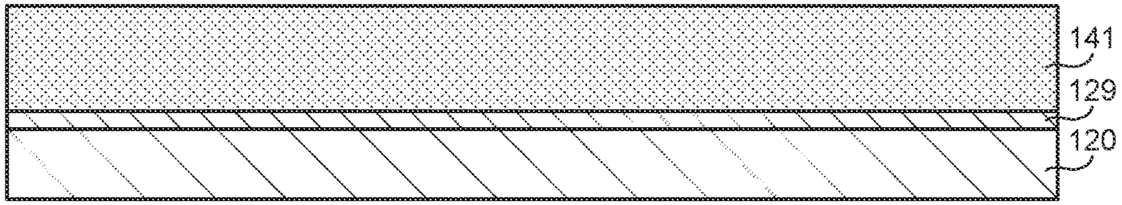
FIG. 8A is a diagram illustrating an example of a manufacturing method of the imaging device according to the first embodiment of the disclosure.

First, well regions, n-type semiconductor regions 121, and others are formed in the first semiconductor substrate 120, and the insulating film 129 is disposed. Next, gate electrodes 131 (not illustrated) and others are arranged. Next, the insulating layer 141 is disposed (FIG. 8A).

Figure 8B:
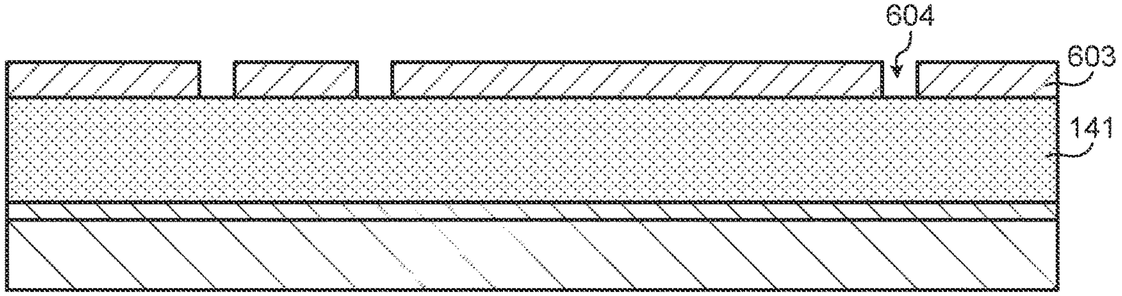
FIG. 8B is a diagram illustrating an example of the manufacturing method of the imaging device according to the first embodiment of the disclosure.

Then, a resist 603 is disposed on the front side of the insulating layer 141. In the resist 603, openings 604 are formed in regions where the connection sections 251 are arranged (FIG. 8B).

Figure 8C:
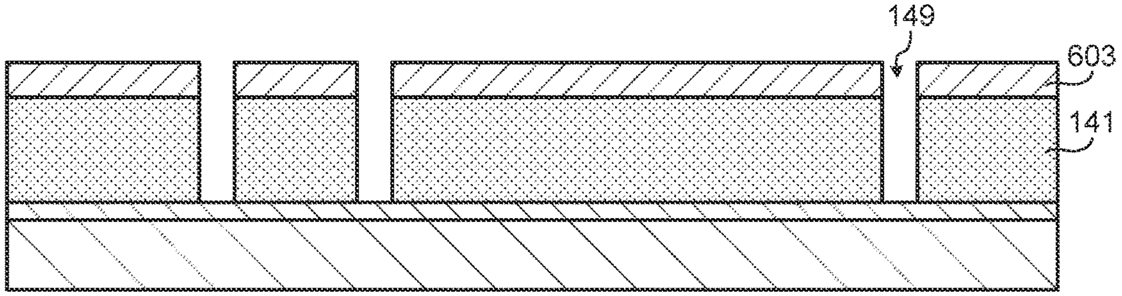
FIG. 8C is a diagram illustrating an example of the manufacturing method of the imaging device according to the first embodiment of the disclosure.

Next, the insulating layer 141 is etched using the resist 603 as a mask. Dry etching can be adopted as this etching. As a result, openings 149 are formed in the insulating layer 141 (FIG. 8C).

Figure 8D:
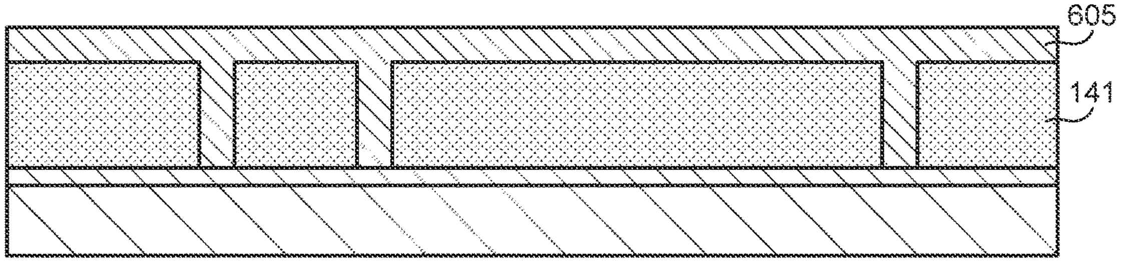
FIG. 8D is a diagram illustrating an example of the manufacturing method of the imaging device according to the first embodiment of the disclosure.

Next, a material film 605 of the connection sections 251 is disposed on the front side of the insulating layer 141 including the openings 149. This can be performed, for example, by forming a polycrystalline silicon film using chemical vapor deposition (CVD) or the like (FIG. 8D).

Figure 8E:
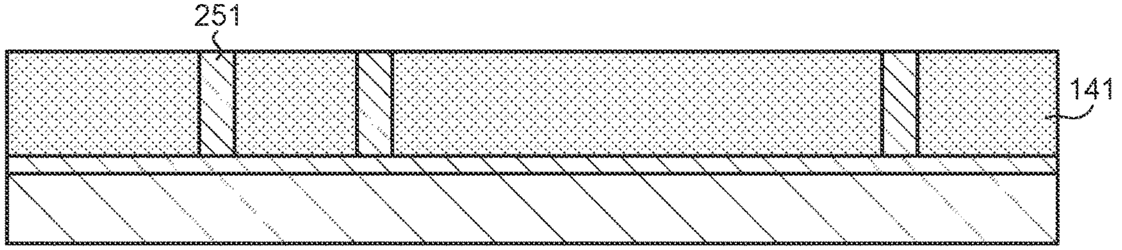
FIG. 8E is a diagram illustrating an example of the manufacturing method of the imaging device according to the first embodiment of the disclosure.

Next, the material film 605 disposed outside the opening 149 is removed. This can be performed by grinding the front side of the first semiconductor substrate 120. For this grinding, for example, chemical mechanical polishing (CMP) can be adopted. As a result, the connection sections 251 having a shape embedded in the insulating layer 141 can be formed (FIG. 8E). Note that this step presumes CMP in which the material film 605 has a higher grinding selectivity than that of the insulating layer 141. As a result, the connection sections 251 after grinding have an end having substantially the same height as the surface of the insulating layer 141 or an end lower than the insulating layer 141.

Figure 8F:
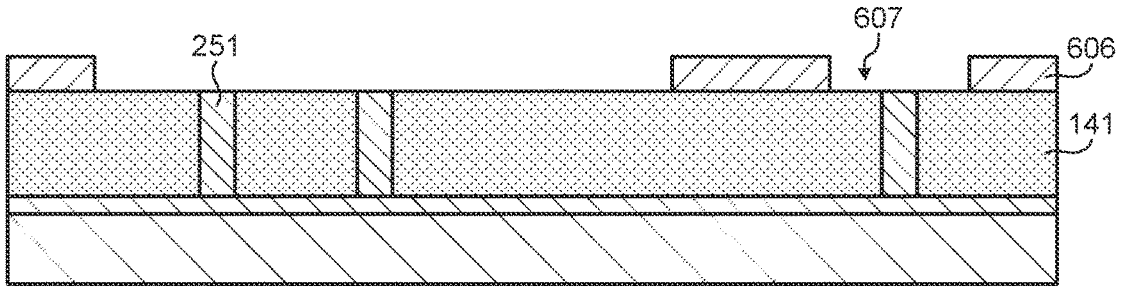
FIG. 8F is a diagram illustrating an example of the manufacturing method of the imaging device according to the first embodiment of the disclosure.

Next, a resist 606 is disposed on the front side of the insulating layer 141. In the resist 606, an opening 607 is formed in a region where the recess 151 is to be formed (FIG. 8F).

Figure 8G:
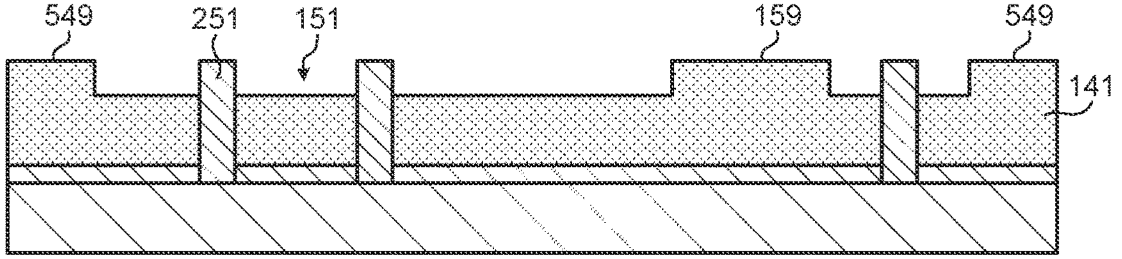
FIG. 8G is a diagram illustrating an example of the manufacturing method of the imaging device according to the first embodiment of the disclosure.

Next, the insulating layer 141 is etched using the resist 606 as a mask to form the recess 151. Dry etching or wet etching can be adopted as this etching. In addition, as this etching, by applying etching having a high selectivity of $SiO_2$ that is the material of the insulating layer 141 as polycrystalline silicon that is the material of the connection section 251, it is made possible to form the connection sections 251 having a shape protruding from the bottom surface of the recess 151 after the etching (FIG. 8G).

Figure 8H:
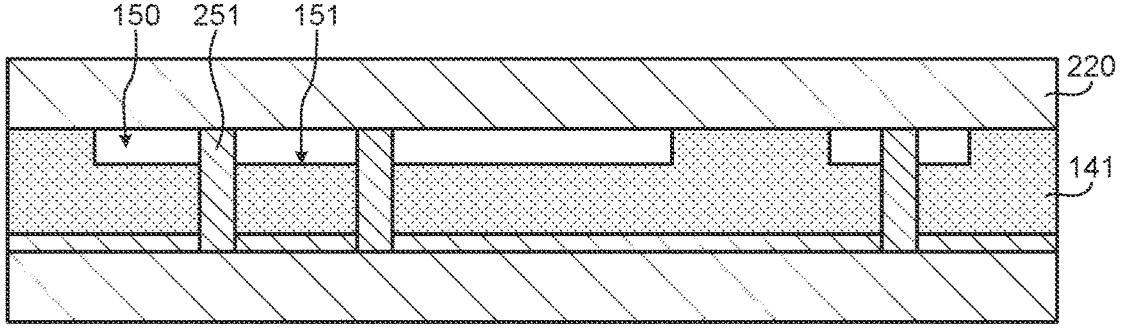
FIG. 8H is a diagram illustrating an example of the manufacturing method of the imaging device according to the first embodiment of the disclosure.

Next, the second semiconductor substrate 220 is bonded and stacked on the front side of the first semiconductor substrate 120. This bonding can be performed by overlaying and pressing the second semiconductor substrate 220 against the front side of the insulating layer 141 and heating. As a result, the first semiconductor substrate 120 and the second semiconductor substrate 220 are bonded and stacked. At this point, the ends of the connection sections 251 are connected to the semiconductor region 228 (not illustrated) of the second semiconductor substrate 220. Furthermore, the gap 150 is formed by this stacking. By performing the step of stacking the first semiconductor substrate 120 and the second semiconductor substrate 220 in a vacuum, the gap 150 can be evacuated (FIG. 8H).

Figure 8I:
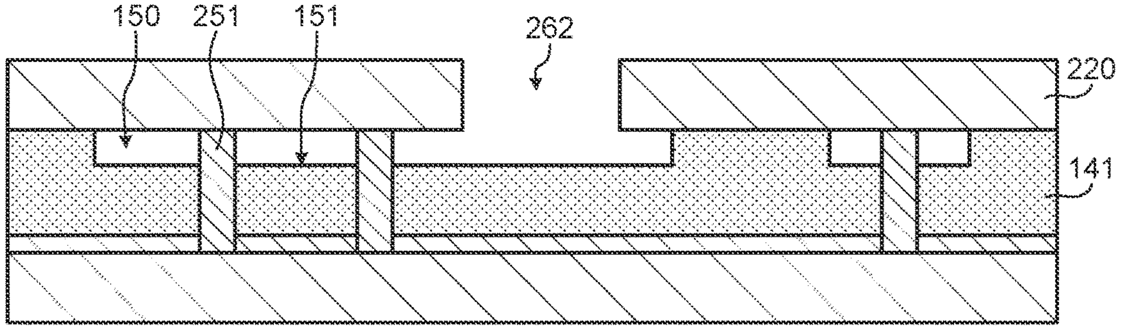
FIG. 8I is a diagram illustrating an example of the manufacturing method of the imaging device according to the first embodiment of the disclosure.

Next, a substrate isolation region 262 is formed in the second semiconductor substrate 220. This can be performed by etching the second semiconductor substrate 220. Dry etching can be adopted as this etching (FIG. 8I).

Figure 8J:
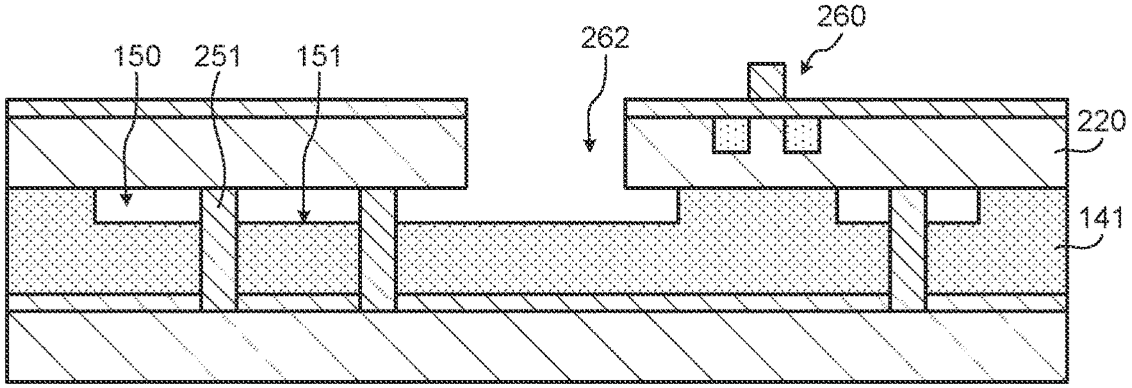
FIG. 8J is a diagram illustrating an example of the manufacturing method of the imaging device according to the first embodiment of the disclosure.

Next, a semiconductor region 221 and others are formed in the second semiconductor substrate 220, and elements such as the insulating film 229 or the capacitance switching transistor 212 are formed. As a result, the element region 260 is formed (FIG. 8J).

Figure 8K:
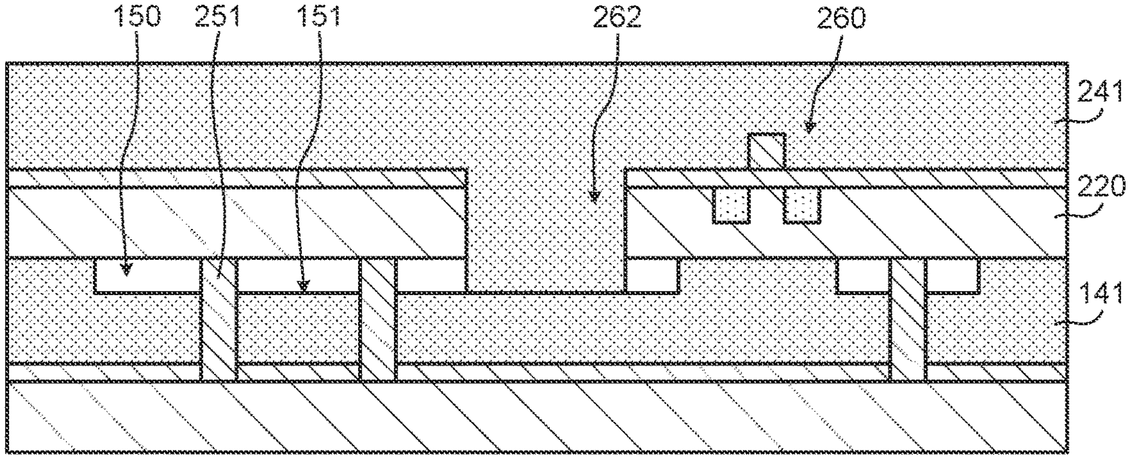
FIG. 8K is a diagram illustrating an example of the manufacturing method of the imaging device according to the first embodiment of the disclosure.

Next, the insulating layer 241 is disposed on the front side of the second semiconductor substrate 220. This can be performed, for example, by forming a $SiO_2$ film using CVD or the like (FIG. 8K). At this point, a part of the recess 151 is filled with the insulating layer 241.

Figure 8L:
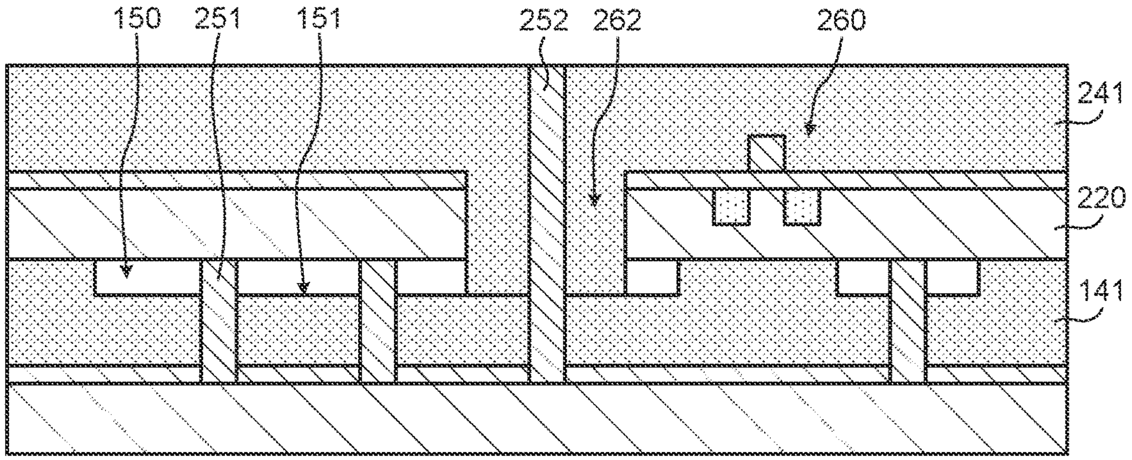
FIG. 8L is a diagram illustrating an example of the manufacturing method of the imaging device according to the first embodiment of the disclosure.

Next, a through electrode 252 is disposed. This can be performed by forming a through hole in the insulating layer 141 and the insulating layer 241 in the substrate isolation region 262 and filling a material of the through electrode 252 such as polycrystalline silicon (FIG. 8L).

Thereafter, the imaging device 1 can be manufactured by forming the wiring layer 200T and stacking the third semiconductor substrate 320.

[Another Manufacturing Method of Imaging Device]

Figure 9A:
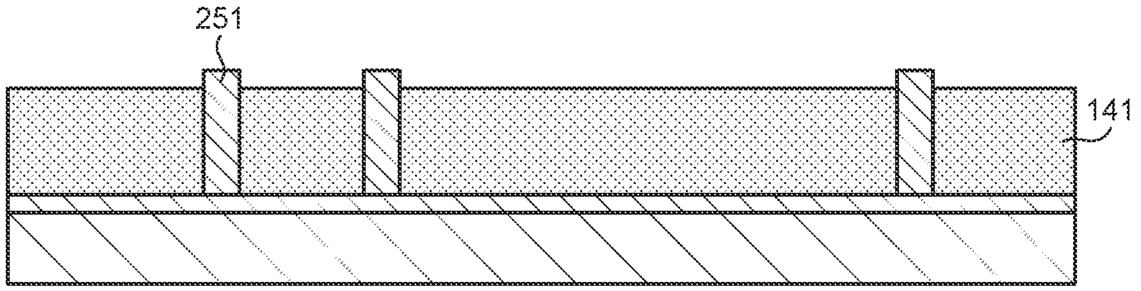
FIG. 9A is a diagram illustrating another example of the manufacturing method of the imaging device according to the first embodiment of the disclosure.
Figure 9B:
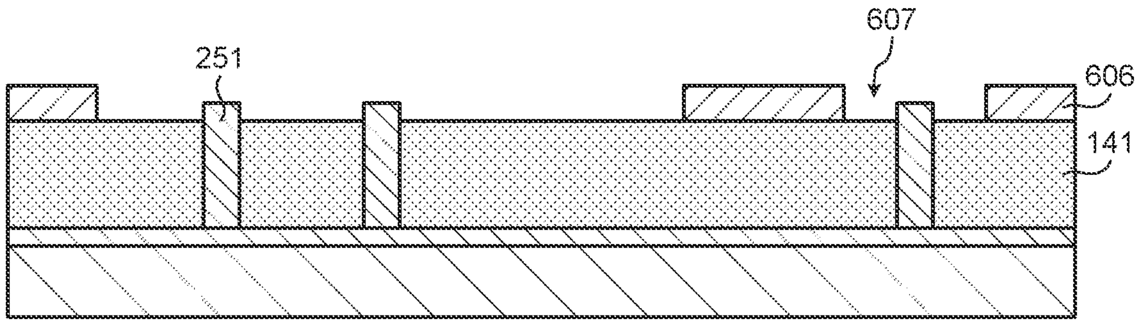
FIG. 9B is a diagram illustrating the other example of the manufacturing method of the imaging device according to the first embodiment of the disclosure.
Figure 9C:
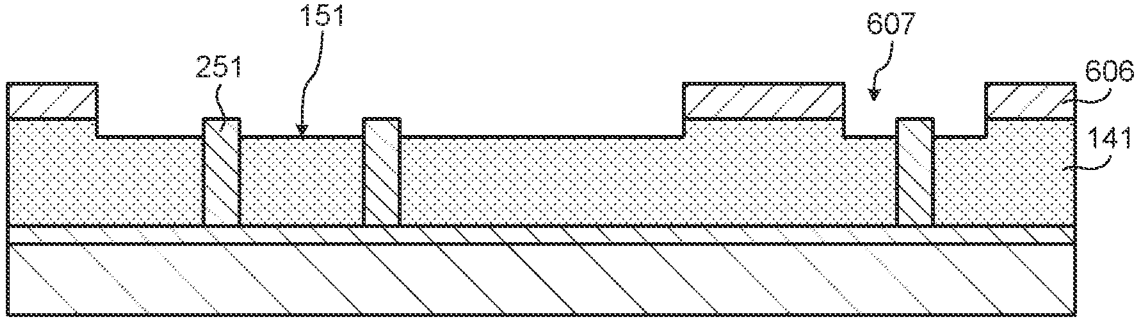
FIG. 9C is a diagram illustrating the other example of the manufacturing method of the imaging device according to the first embodiment of the disclosure.

FIGS. 9A, 9B, and 9C are diagrams illustrating another example of the manufacturing method of the imaging device according to the first embodiment of the present disclosure. The drawings are diagram illustrating an example of the manufacturing steps of the imaging device 1, similarly to FIGS. 8A, 8B, 8C, 8D, 8E, 8F, 8G, 8H, 8I, 8J, 8K, and 8L. The manufacturing method in these drawings is different from the manufacturing method in FIGS. 8A, 8B, 8C, 8D, 8E, 8F, 8G, 8H, 8I, 8J, 8K, and 8L in that the connection sections 251 formed in the step before formation of the recess 151 are formed in a shape protruding from the surface of the insulating layer 141.

Similarly to FIG. 8E, FIG. 9A illustrates a step of forming the connection sections 251 by CMP. In this CMP, in a case of adopting CMP in which the material film 605 has a lower grinding selectivity than that of the insulating layer 141, as illustrated in FIG. 9A, ends of the connection sections 251 has a shape protruding from the insulating layer 141. Alternatively, in a step after formation of the connection sections 251, the insulating layer 141 may be ground to obtain the connection sections 251 having a protruding shape.

In FIG. 9B, as in FIG. 8F, a resist 606 is disposed on the front side of the insulating layer 141 (FIG. 9B).

Next, the insulating layer 141 is etched using the resist 606 as a mask. As this etching, etching is performed under a condition that the selectivity of polycrystalline silicon as the material of the connection sections 251 and the selectivity of SiO2 as the material of the insulating layer 141 are low. As a result, the insulating layer 141 and the connection sections 251 are etched at substantially the same rate. By this etching, the recess 151 is formed, and the connection sections 251 having a height lower than the depth of the recess 151 can be formed (FIG. 9C). The steps of FIGS. 8H, 8I, 8J, 8K, and 8L can be applied to the subsequent manufacturing steps.

As described above, even in a case where the connection sections 251 having a shape in which an end protrudes from the insulating layer 141 are arranged, the recess 151 and the connection sections 251 having a height lower than the depth of the recess 151 can be formed.

[Effect of Recess]

Figure 10A:
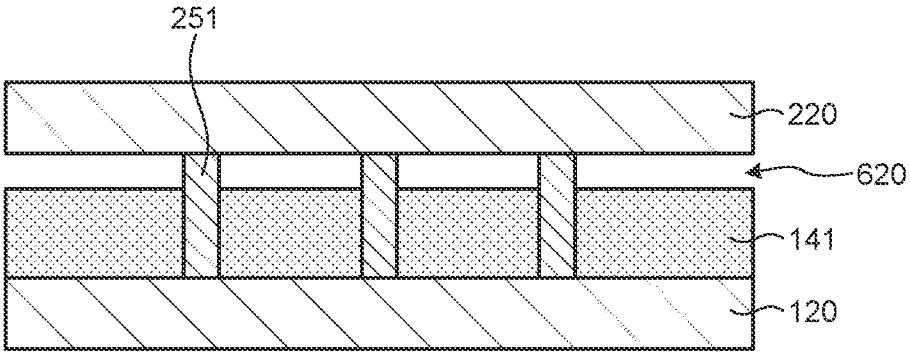
FIG. 10A is a diagram for describing an effect of the recess according to the first embodiment of the disclosure.
Figure 10B:
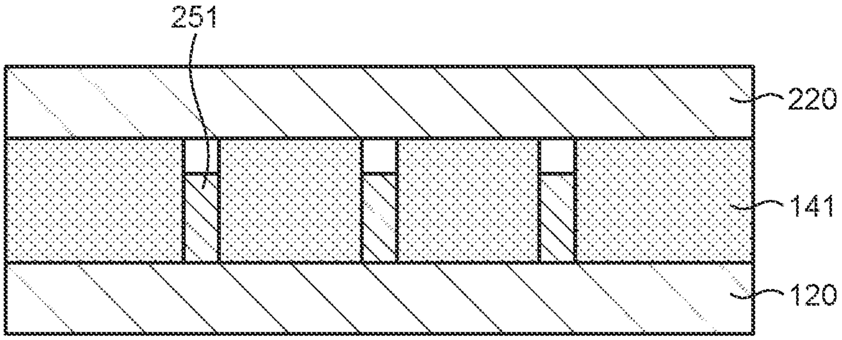
FIG. 10B is a diagram for describing an effect of the recess according to the first embodiment of the disclosure.

FIGS. 10A and 10B are diagrams for describing an effect of the recess according to the first embodiment of the disclosure. These drawings are diagrams illustrating defects that occur in cases where the recess 151 is not applied.

FIG. 10A is a diagram illustrating a case where the connection sections 251 are formed in a shape protruding from the surface of the insulating layer 141. When the second semiconductor substrate 220 is bonded to and stacked on the first semiconductor substrate 120 having the connection sections 251, a gap 620 is generated between the insulating layer 141 and the second semiconductor substrate 220. For this reason, the bonding strength between the first semiconductor substrate 120 and the second semiconductor substrate 220 decreases. There is a high possibility that the connection sections 251 are damaged in conveyance or others in subsequent steps. In addition, in a case where gas such as the air enters the gap 620, the gas in the gap 620 may expand and cause a damage in a process involving heating.

FIG. 10B is a diagram illustrating a case where the connection sections 251 are formed in a shape lower than the insulating layer 141. In this case, even though the second semiconductor substrate 220 is bonded to the first semiconductor substrate 120 having the connection sections 251, the ends of the connection sections 251 do not reach the back side of the second semiconductor substrate 220 as illustrated in the drawing. Therefore, the connection sections 251 cannot contact the second semiconductor substrate 220, and a connection failure occurs.

By disposing the recess 151 in the insulating layer 141 of the first semiconductor substrate 120, occurrence of these defects can be prevented. Note that the connection sections 251 may be connected to a region other than the well regions of the first semiconductor substrate 120 and the second semiconductor substrate 220 to transmit a signal other than the reference potential. Also in this case, the recess 151 can be disposed around the connection sections 251.

As described above, the imaging device 1 according to the first embodiment of the present disclosure includes the recess 151 around the connection sections 251 on a surface of the insulating layer 141 of the first semiconductor substrate 120, the surface adjacent to the second semiconductor substrate 220. As a result, even in a case where the height of the connection sections 251, the thickness of the insulating layer 141, or others vary, the connection sections 251 and the second semiconductor substrate 220 can be connected. The first semiconductor substrate 120 and the second semiconductor substrate can be easily stacked.

2. Second Embodiment

In the imaging device 1 of the first embodiment described above, the recess 151 is formed in a region other than the element regions 260. On the other hand, an imaging device 1 according to a second embodiment of the present disclosure is different from the above-described first embodiment in that wiring is disposed in a wiring layer 100T of a first semiconductor substrate 120 and that a recess 151 is formed in a region other than a region where the wiring is disposed.

[Configuration of Pixel]

Figure 11:
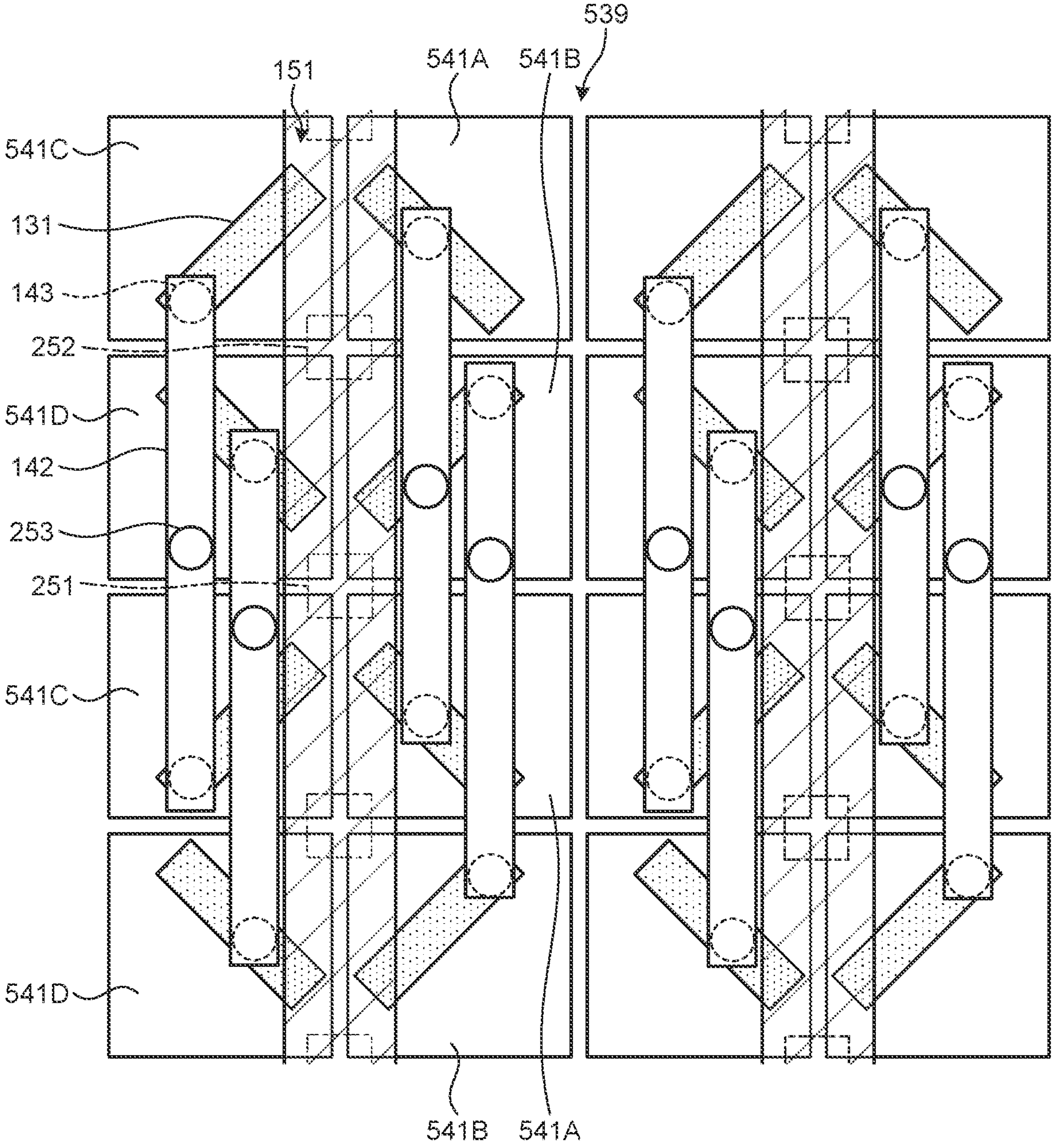
FIG. 11 is a diagram illustrating a configuration example of pixels according to a second embodiment of the disclosure.

FIG. 11 is a diagram illustrating a structure example of pixels according to the second embodiment of the disclosure. The drawing is a plan view illustrating a structure example of the pixels (pixels 541A, 541B, 541C, and 541D) included in a pixel sharing unit 539, similarly to FIG. 5. The pixels in the drawing are different from the pixels in FIG. 5 in that wiring 142 is disposed in a wiring layer 100T. In the drawing, four sets of pixels 541A, 541B, 541C, and 541D are illustrated. Note that, in the drawing, description of elements and others arranged in a charge holding section 103, a semiconductor region 123, and a second semiconductor substrate 220 is omitted.

The wiring layer 100T in the drawing includes the wiring 142. White rectangles in the drawing represent the wiring 142. The wiring 142 commonly transmits a pixel signal in the neighboring pixel sharing units 539. The wiring 142 in the drawing represents an example of transmitting signals of gates of charge transfer sections 102. The wiring 142 at the left end in the drawing connects gate electrodes 131 in charge transfer sections 102 of respective pixels 541A of two pixel sharing units 539 adjacent to each other in the vertical direction in the drawing. A contact plug 143 is disposed between the wiring 142 and a gate electrode 131. In addition, a through electrode 253 is connected to the wiring 142. Connection by the wiring 142 is similar also in the pixels 541B, 541C, and 541D. In this manner, by forming the wiring 142 in the wiring layer 100T to share signals between two pixels and connecting a through electrode 253 to the wiring 142, the through electrode 253 can be shared between the two pixels. As a result, the number of through electrodes 253 can be reduced. The wiring 142 and the contact plugs 143 can be made of polycrystalline silicon doped with an impurity.

A recess 151 in the drawing can be disposed in a region other than a region where the wiring 142 is arranged. Since no recess 151 is formed at a position overlapping the wiring 142, it is possible to prevent a decrease in the thickness of the insulating layer 141 in the vicinity of the wiring 142 and to prevent a decrease in the insulation performance of the insulating layer 141 with respect to the wiring 142.

In addition, the recesses 151 in the drawing represent an example of being in a band shape in a plan view. As illustrated in the drawing, the wiring 142 is wired in the vertical direction in the drawing. Therefore, the recesses 151 can be formed in a band shape parallel to the wiring 142.

[Structure of Recess]

Figure 12:
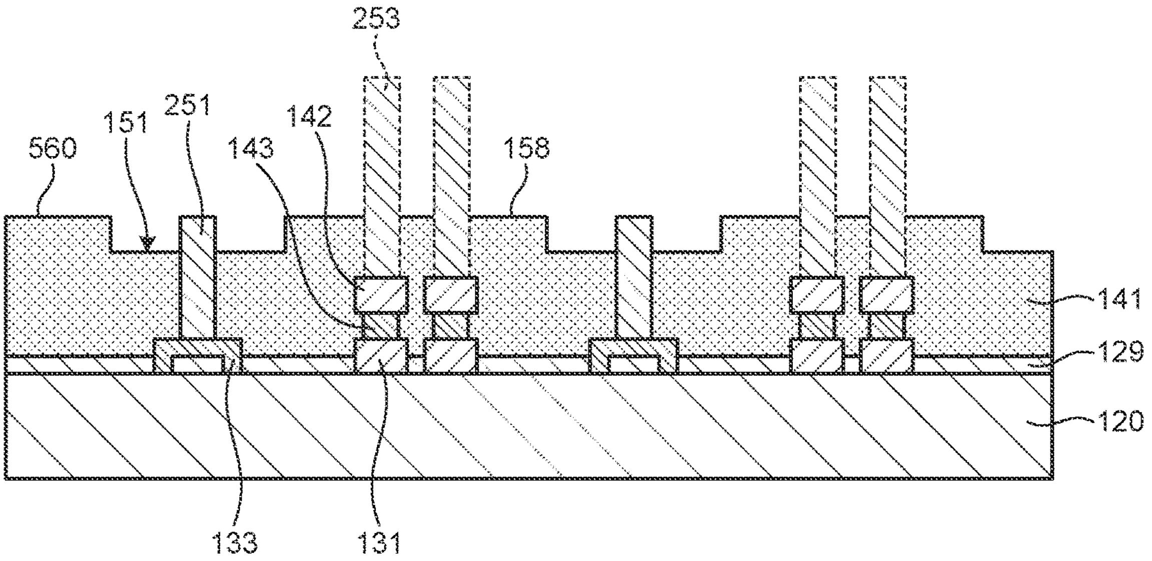
FIG. 12 is a diagram illustrating a structure example of a recess according to the second embodiment of the disclosure.

FIG. 12 is a diagram illustrating a structure example of a recess according to the second embodiment of the disclosure. The drawing is a schematic cross-sectional view illustrating a structure example of the recess 151 similarly to FIG. 7. The drawing illustrates the structure of a first semiconductor substrate 120 before stacking and a structure of a cross section perpendicular to the direction of the bands of the recesses 151. Note that a dotted rectangle in the drawing represents a through electrode 253 formed after the second semiconductor substrate 220 is stacked. Note that, in the drawing, illustration of semiconductor regions 123 and others in the first semiconductor substrate 120 is omitted.

A region 158 of an insulating layer 141 in the drawing represents a region where the wiring 142 is disposed. The recesses 151 in the drawing are arranged in regions different from the region 159. As illustrated in the drawing, since no recesses 151 are arranged above the wiring 142, a decrease in the film thickness of the insulating layer 141 above the wiring 142 can be prevented.

The configuration of the imaging device 1 other than the above is similar to the configuration of the imaging device 1 in the first embodiment of the present disclosure, and thus description thereof is omitted.

As described above, in the imaging device 1 according to the second embodiment of the present disclosure, the recesses 151 are arranged in regions of the insulating layer 141 other than the region where the wiring 142 is disposed in the wiring layer 200T of the first semiconductor substrate 120. As a result, it is possible to prevent a decrease in insulation performance of the insulating layer 141 above the wiring 142.

3. First Modification

The imaging device 1 of the first embodiment described above uses an amplification transistor 213 by a planar MOS transistor, however, a FinFET can also be applied.

[Structure of Cross-Section of Imaging Device]

Figure 13:
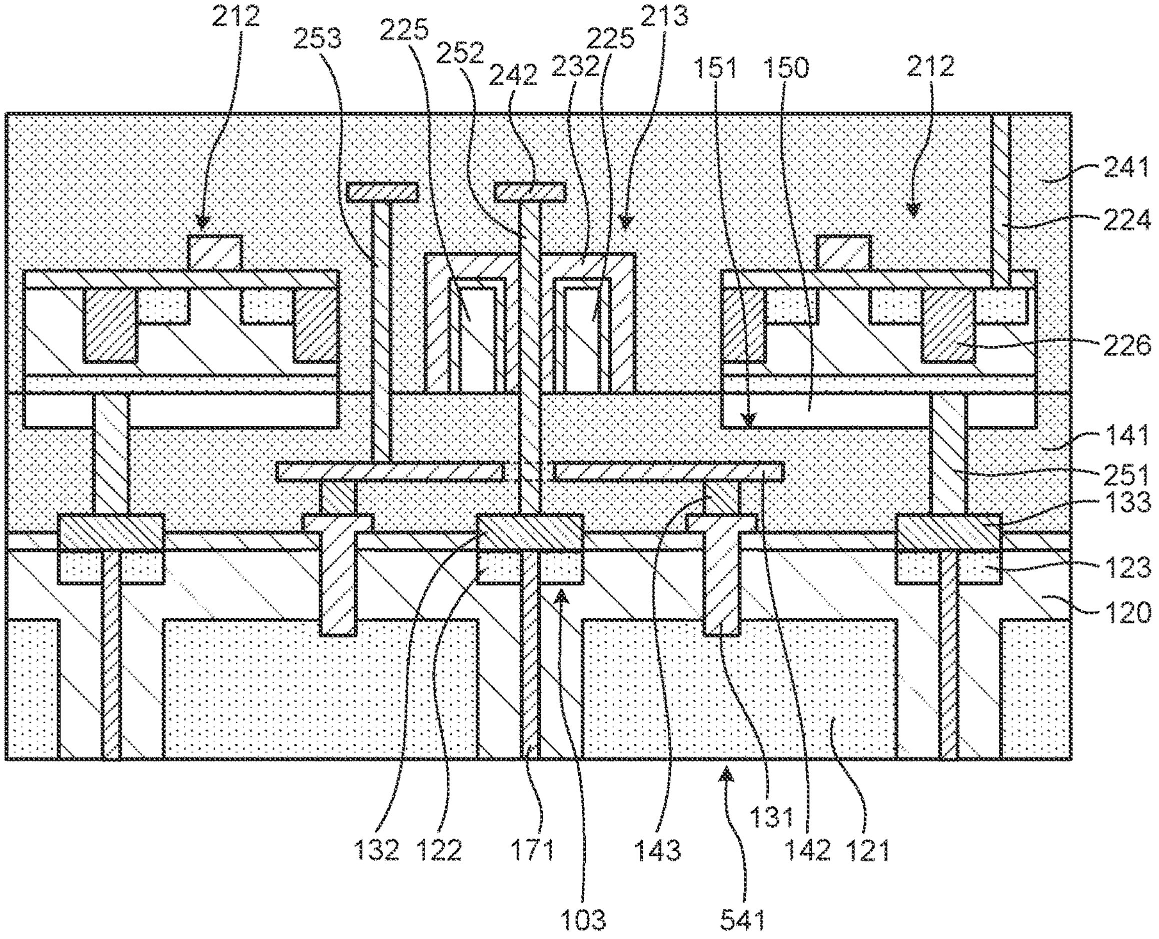
FIG. 13 is a cross-sectional view illustrating a structure example of an imaging device according to a first modification of an embodiment of the disclosure.

FIG. 13 is a cross-sectional view illustrating a structure example of an imaging device according to a first modification of the embodiments of the disclosure. The drawing is a cross-sectional view illustrating a structure example of an imaging device 1 similarly to FIG. 6. The imaging device 1 in the drawing is different from the imaging device 1 in FIG. 6 in that an amplification transistor 213 by a FinFET is included.

The amplification transistor 213 in the drawing has a shape in which a gate electrode 232 is disposed on three sides excluding the bottom surface of a semiconductor region 225 of a rectangular parallelepiped shape via a gate insulating film. The amplification transistor 213 having such a shape is referred to as a FinFET. In addition, the amplification transistor 213 in the drawing illustrates an example in which the gate electrode 232 is disposed in a manner shared by two semiconductor regions 225 arranged in parallel to each other. The gate electrode 232 is connected to a pad 132 adjacent to a charge holding section 103 via a through electrode 252. The through electrode 252 is formed in a shape penetrating through the gate electrode 232 and the insulating layer 141 and is connected to the gate electrode 232 on a side surface.

Note that the structure of the FinFET is not limited to this example. For example, the gate electrode 232 may be disposed in one semiconductor region 225. Alternatively, three or more semiconductor regions 225 may be included. Further alternatively, the through electrode 252 can be disposed between a side surface of the gate electrode 232 and the insulating layer 241, and the side surface of the through electrode 252 may be formed in a shape to be in contact with a side surface of the gate electrode 232. In this case, the side surface of the gate electrode 232 corresponds to one of two side surfaces (right side surface and left side surface of the gate electrode 232 in the drawing) in a shape covering the entire one or more semiconductor regions 225.

A capacitance switching transistor 212 in the drawing includes a MOS transistor having a planar gate structure. Note that the capacitance switching transistor 212 in the drawing illustrates an example of separation by shallow trench isolation (STI) 226.

Note that the entire back side of the pad 133 in the drawing is formed in a shape adjacent to a first semiconductor substrate 120 and is disposed in a shape extending across an isolation section 171. A semiconductor region 123 is formed in the first semiconductor substrate 120 in a layer under the pad 133. The semiconductor region 123 in the drawing is a semiconductor region formed by allowing an impurity contained in polycrystalline silicon forming the pad 133 to diffuse into the first semiconductor substrate 120. Similarly to the pad 133, the entire back side of the pad 132 in the drawing is also formed in a shape adjacent to the first semiconductor substrate 120 and extending across an isolation section 171. A semiconductor region 122 included in a charge holding section 103 is formed in the first semiconductor substrate 120 in a layer under the pad 132. The semiconductor region 122 can also be formed by allowing an impurity contained in the pad 132 to diffuse into the first semiconductor substrate 120.

4. Second Modification

The imaging device 1 of the first embodiment described above includes the recess 151 in a region other than the element regions 260, however, the imaging device 1 may include a recess 151 of another structure.

[Structure of Recess]

Figure 14A:
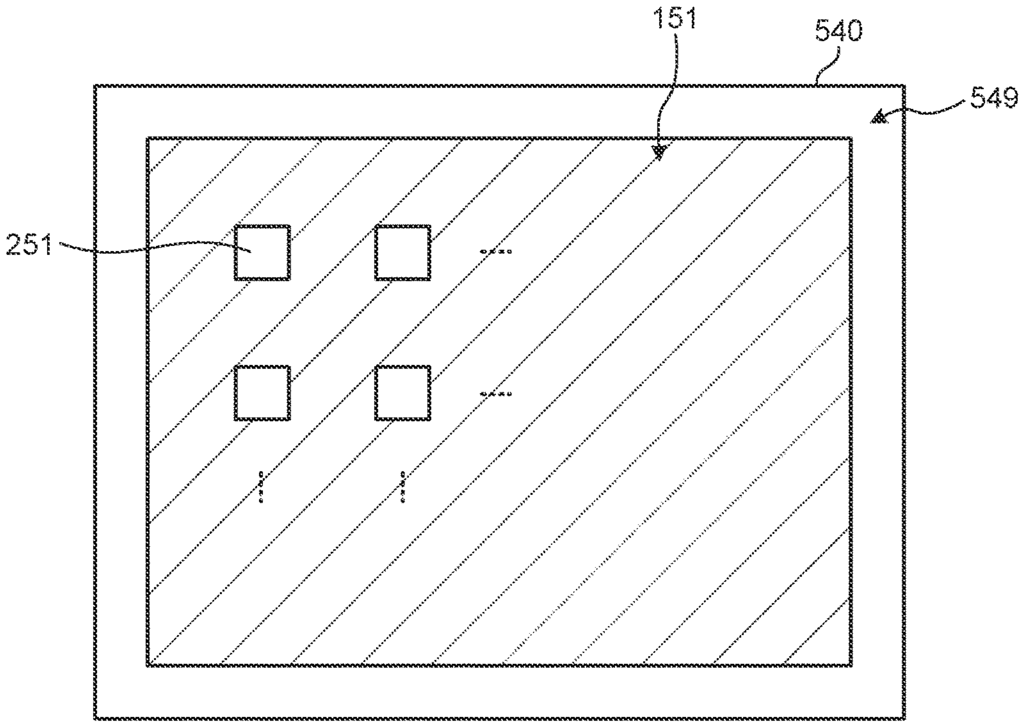
FIG. 14A is a diagram illustrating a structure example of a recess according to a second modification of an embodiment of the disclosure.
Figure 14B:
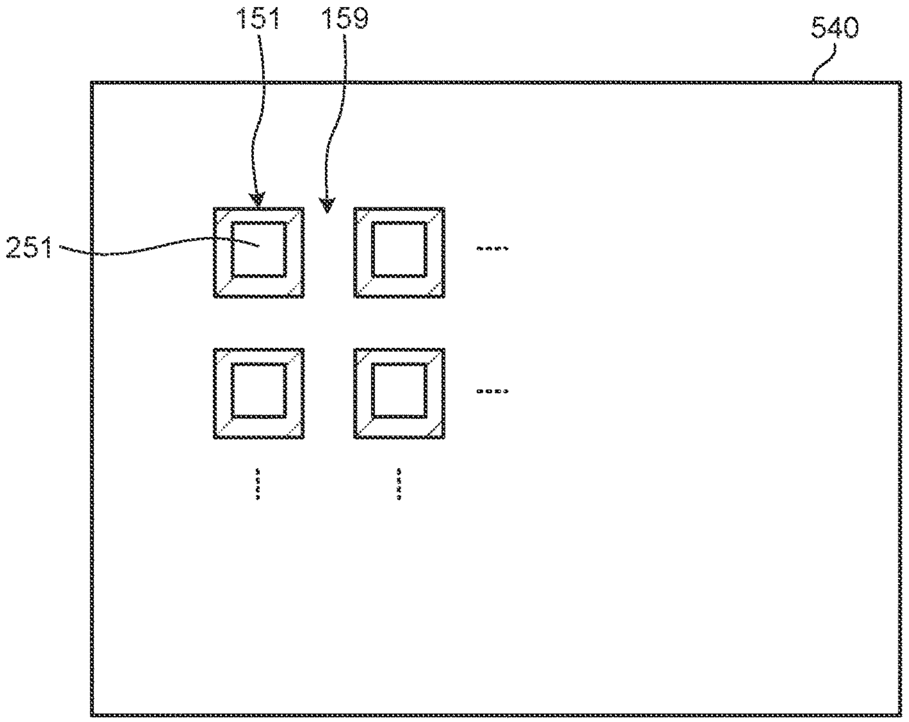
FIG. 14B is a diagram illustrating a configuration example of recesses according to the second modification of the embodiment of the disclosure.

FIGS. 14A and 14B are diagrams illustrating a structure example of a recess according to a second modification of the embodiments of the disclosure. The drawing is a plan view illustrating the structure example of the recess 151.

FIG. 14A is a diagram illustrating an example of a recess 151 disposed in a region other than a peripheral edge 549 of a pixel array section 540. In addition, unlike the recess 151 described in FIG. 5, the recess 151 in the drawing represents an example in which the recess 151 is formed also in regions immediately below element regions 260 of a second semiconductor substrate 220. With the recess 151 having a relatively large area and having a shape that widely extends outside regions where connection sections 251 are arranged, it is possible to easily perform bonding between the connection sections 251 and the second semiconductor substrate 220. This is because the connection sections 251 are arranged at positions away from the ends of the recess 151 and because the second semiconductor substrate 220 is curved so as to be contactable with the ends of the connection sections 251.

FIG. 14B is a diagram illustrating an example of a recess 151 formed in an island shape. A recess 151 in the drawing represents an example in which the recess 151 is formed in a relatively narrow area around one connection section 251. A region of an insulating layer 141 bonded to a second semiconductor substrate 220 can be widened, and a decrease in strength of a first semiconductor substrate 120 and the second semiconductor substrate 220 after stacking can be mitigated.

Note that the structure of the recess 151 is not limited to this example. The recess 151 can be in any shape.

The configuration of the imaging device 1 other than the above is similar to the configuration of the imaging device 1 in the first embodiment of the present disclosure, and thus description thereof is omitted.

5. Application Examples

Figure 15:
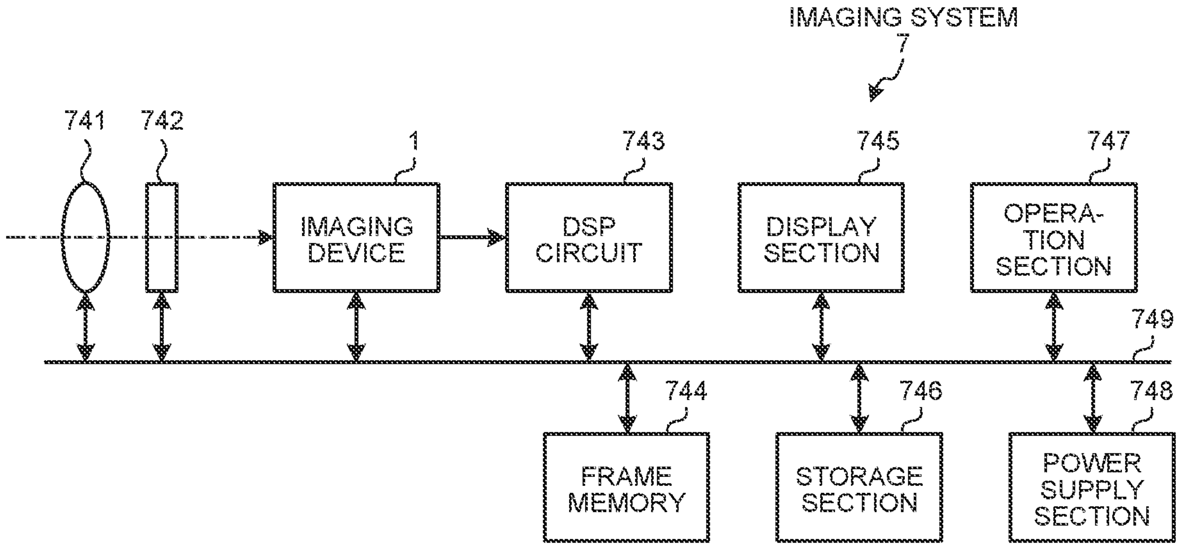
FIG. 15 is a diagram illustrating an example of a schematic configuration of an imaging system including an imaging device according to the embodiments or the modifications thereof.

FIG. 15 is a diagram illustrating an example of a schematic configuration of an imaging system 7 including the imaging device 1 according to one of the embodiments and the modifications thereof.

The imaging system 7 is an electronic device such as an imaging device, such as a digital still camera or a video camera, or a portable terminal device such as a smartphone or a tablet terminal. The imaging system 7 includes, for example, the imaging device 1 according to one of the above-described embodiments and the modifications thereof, a DSP circuit 743, a frame memory 744, a display section 745, a storage section 746, an operation section 747, and a power supply section 748. In the imaging system 7, the imaging device according one of the embodiments and the modifications thereof, the DSP circuit 743, the frame memory 744, the display section 745, the storage section 746, the operation section 747, and the power supply section 748 are mutually connected via a bus line 749.

The imaging device 1 according to one of the embodiments and the modifications thereof outputs image data corresponding to incident light. The DSP circuit 743 is a signal processing circuit that processes a signal (image data) output from the imaging device 1 according to one of the embodiments and the modifications thereof. The frame memory 744 temporarily holds image data processed by the DSP circuit 743 for every frame. The display section 745 includes a panel-type display device such as a liquid crystal panel or an organic electro luminescence (EL) panel and displays a moving image or a still image captured by the imaging device 1 according to one of the embodiments and the modifications thereof. The storage section 746 records the image data of a moving image or a still image captured by the imaging device 1 according to one of the embodiments and the modifications thereof in a recording medium such as a semiconductor memory or a hard disk. The operation section 747 issues operation commands for various functions of the imaging system 7 on the basis of an operation by a user. The power supply section 748 supplies various power sources that serve as operation power sources of the imaging device 1 according to one of the embodiments and the modifications thereof, the DSP circuit 743, the frame memory 744, the display section 745, the storage section 746, and the operation section 747 to these supply targets as appropriate.

Next, an imaging procedure in the imaging system 7 will be described.

Figure 16:
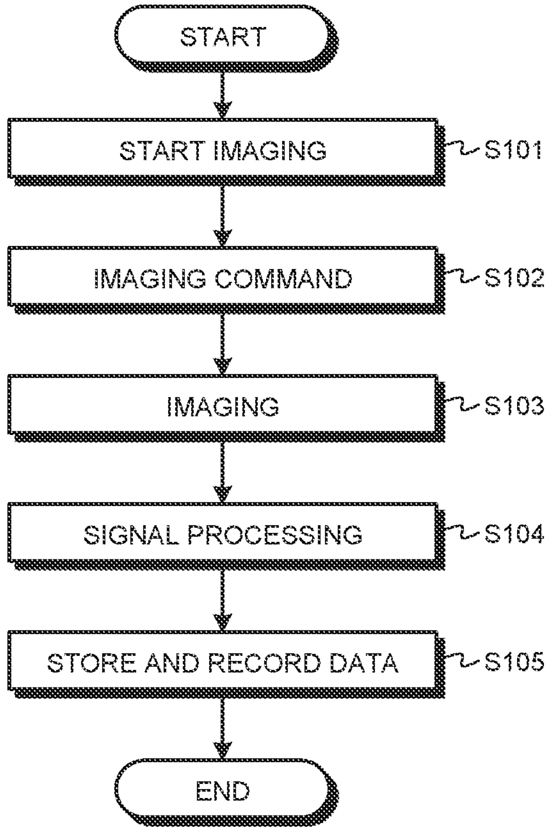
FIG. 16 is a diagram illustrating an example of a flowchart of an imaging operation in the imaging system.

FIG. 16 is a diagram illustrating an example of a flowchart of an imaging operation in the imaging system 7. A user instructs to start imaging by operating the operation section 747 (Step S101). Then, the operation section 747 transmits an imaging command to the imaging device 1 (Step S102). Upon receiving the imaging command, the imaging device 1 (specifically, system control circuit 36) executes imaging by a predetermined imaging scheme (Step S103).

The imaging device 1 outputs image data obtained by the imaging to the DSP circuit 743. Incidentally, the image data refers to data, for all the pixels, of pixel signals generated on the basis of charges temporarily held in floating diffusions FD. The DSP circuit 743 performs predetermined signal processing (for example, noise reduction processing) on the basis of the image data input from the imaging device 1 (Step S104). The DSP circuit 743 causes the frame memory 744 to hold the image data having been subjected to the predetermined signal processing, and the frame memory 744 causes the storage section 746 to record the image data (Step S105). In this manner, imaging in the imaging system 7 is performed.

In the present application example, the imaging device 1 according to one of the above-described embodiments and the modifications thereof is applied to the imaging system 7. As a result, the imaging device 1 can be downsized or have high definition, and thus it is possible to provide the imaging system 7 that is downsized or has high definition.

6. Application Example to Mobile Body

The technology according to the present disclosure (present technology) can be applied to various products. For example, the technology according to the present disclosure may be implemented as a device to be mounted on a mobile body of any type such as automobiles, electric vehicles, hybrid electric vehicles, motorcycles, bicycles, personal mobilities, airplanes, drones, ships, and robots.

Figure 17:
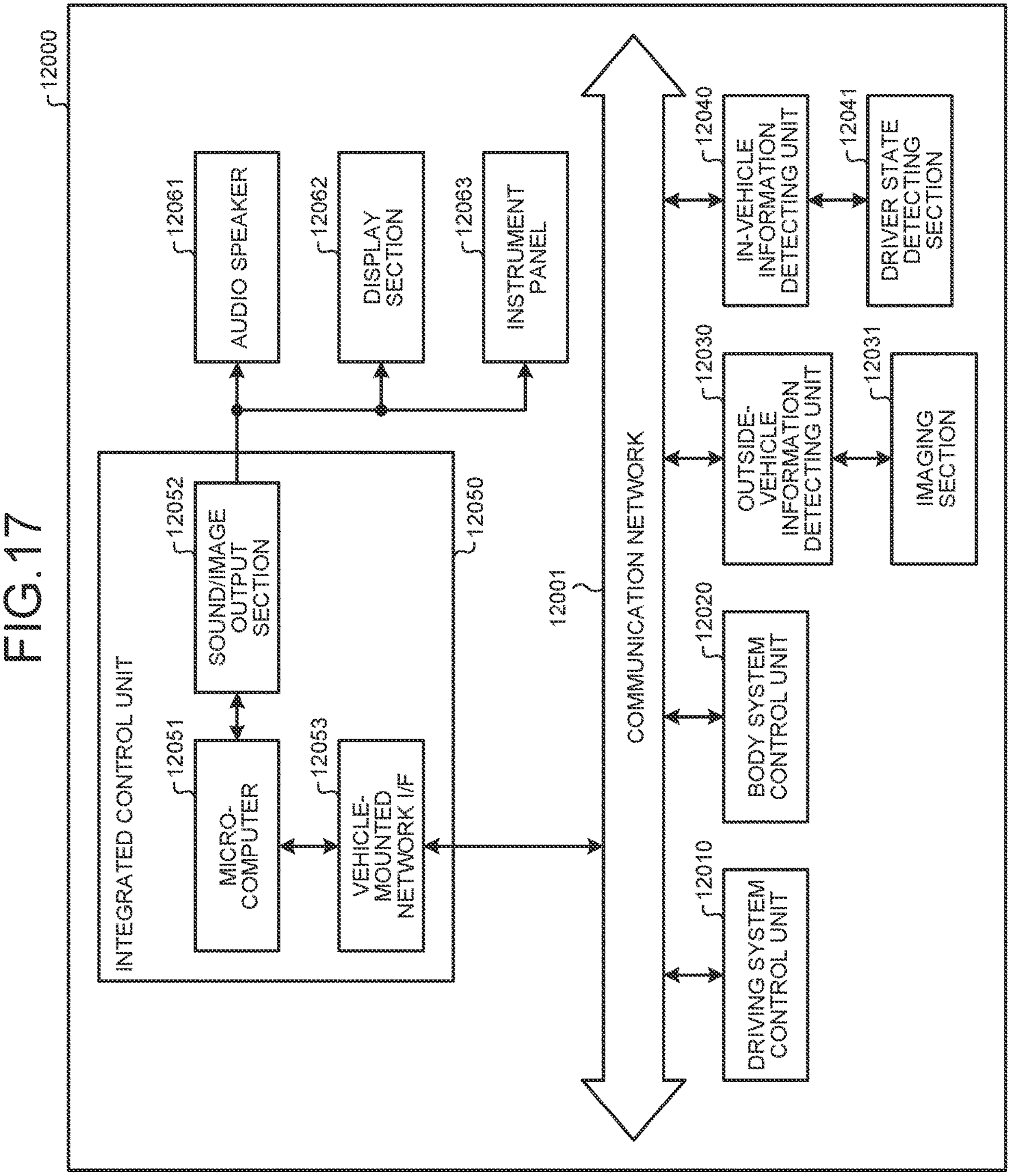
FIG. 17 is a block diagram depicting an example of schematic configuration of a vehicle control system as an example of a mobile body control system to which the technology according to an embodiment of the present disclosure can be applied.

FIG. 17 is a block diagram depicting an example of schematic configuration of a vehicle control system as an example of a mobile body control system to which the technology according to an embodiment of the present disclosure can be applied.

A vehicle control system 12000 includes a plurality of electronic control units connected to each other via a communication network 12001. In the example depicted in FIG. 17, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 17, an audio speaker 12061, a display section 12062, and an instrument panel 12063 are illustrated as the output device. The display section 12062 may, for example, include at least one of an on-board display and a head-up display.

Figure 18:
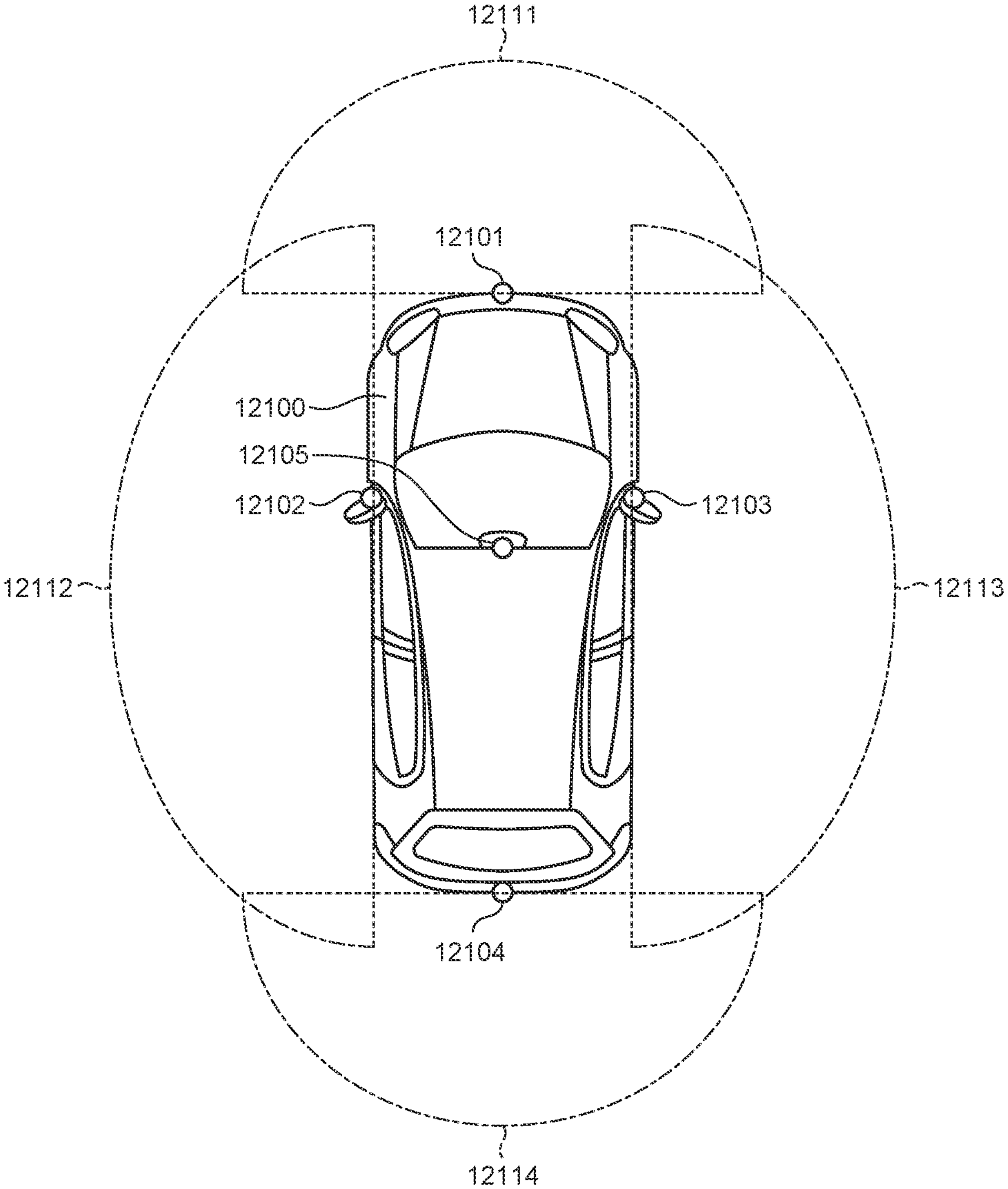
FIG. 18 is a diagram illustrating an example of installation positions of imaging sections.

FIG. 18 is a diagram depicting an example of the installation position of the imaging section 12031.

In FIG. 18, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of a vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 18 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 among the above-described configuration. Specifically, the imaging device 1 in FIG. 1 can be applied to the imaging section 12031. By applying the technology according to the present disclosure to the imaging section 12031, the imaging section 12031 can be downsized.

7. Application Example to Endoscopic Surgery System

The technology according to the present disclosure (present technology) can be applied to various products. For example, the technology according to the present disclosure may be applied to an endoscopic surgery system.

Figure 19:
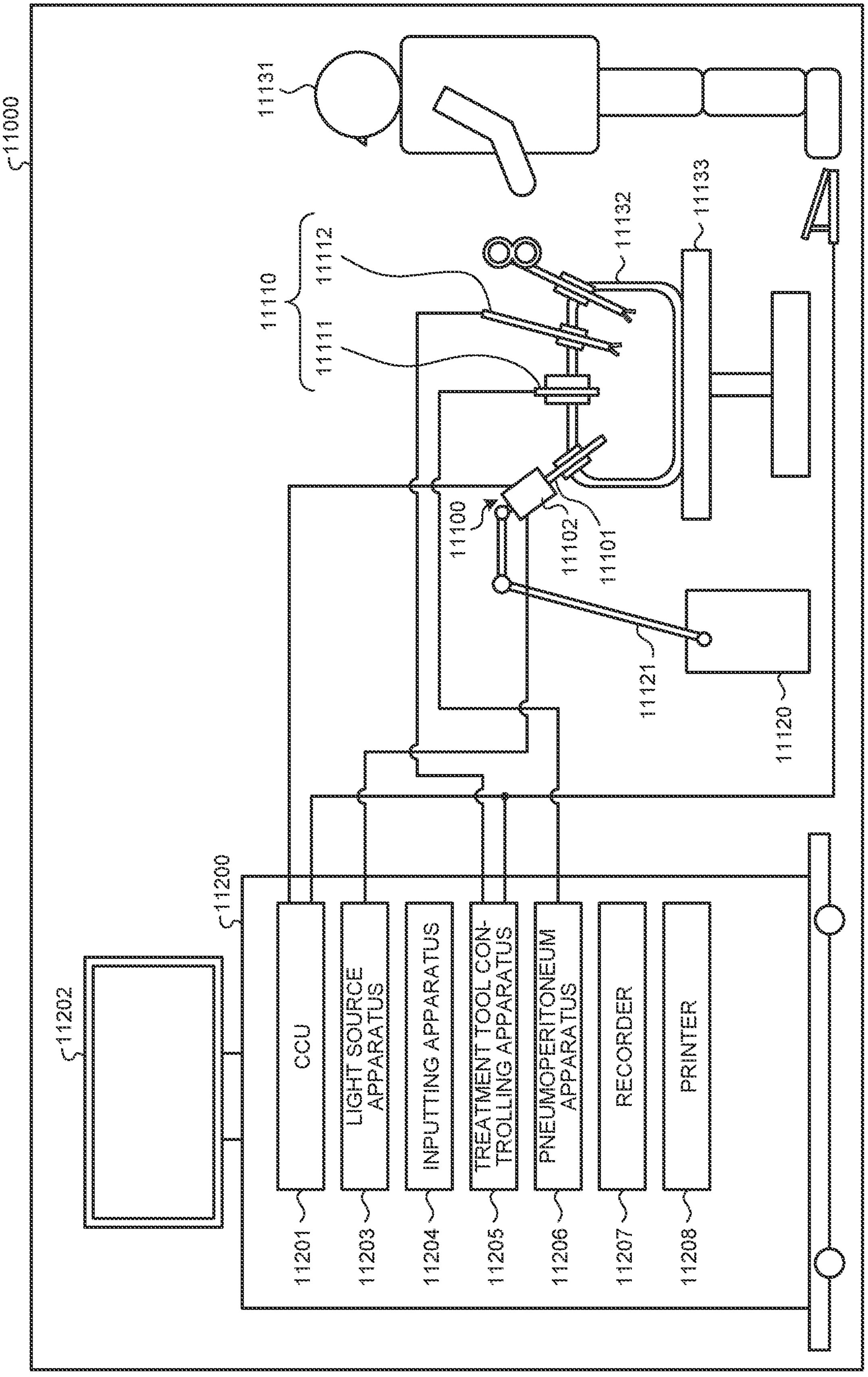
FIG. 19 is a diagram illustrating an example of a schematic configuration of an endoscopic surgery system to which the technology according to the present disclosure (present technology) can be applied.

FIG. 19 is a diagram depicting an example of a schematic configuration of an endoscopic surgery system to which the technology according to the present disclosure (present technology) can be applied.

In FIG. 19, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 20:
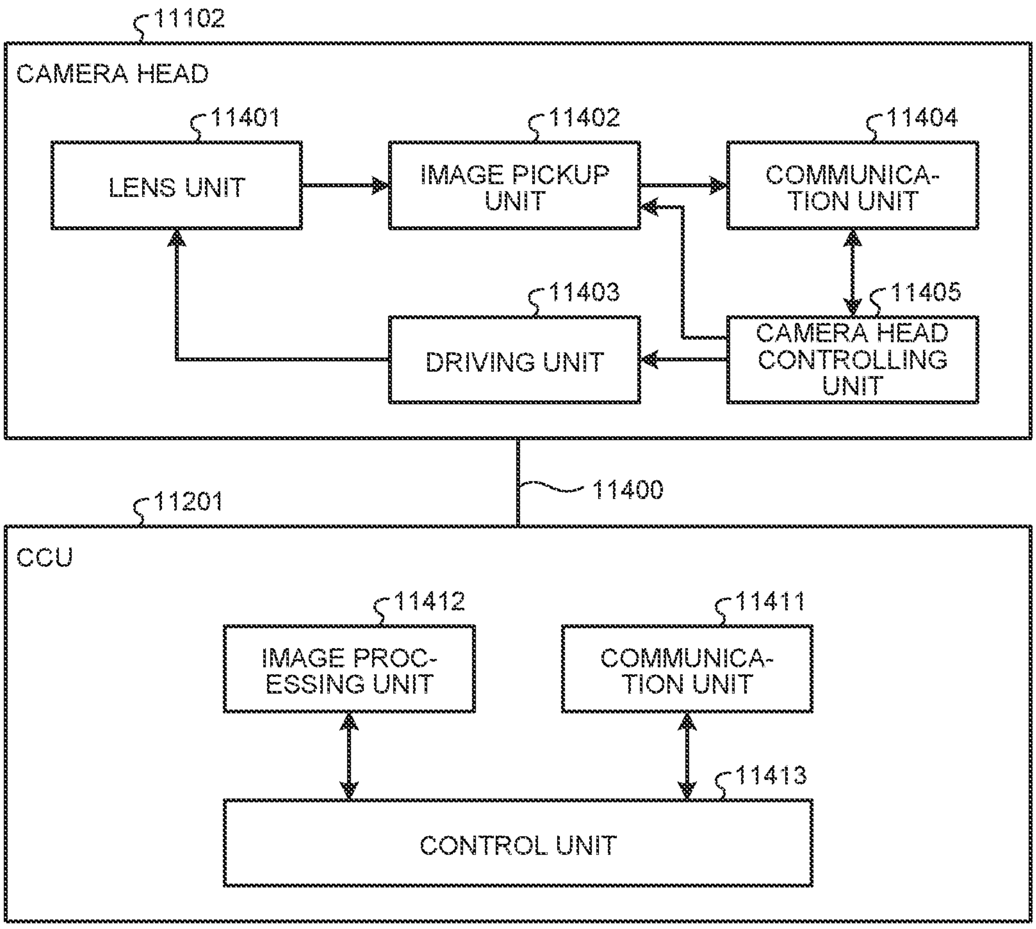
FIG. 20 is a block diagram illustrating an example of a functional configuration of a camera head and a CCU illustrated in FIG. 19.

FIG. 20 is a block diagram depicting an example of a functional configuration of the camera head 11102 and the CCU 11201 depicted in FIG. 19.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure can be applied has been described above. The technology according to the present disclosure can be applied to the endoscope 11100 or the image pickup unit 11402 of the camera head 11102 among the above-described components. Specifically, the imaging device 1 in FIG. 1 can be applied to the image pickup unit 11402. By applying the technology according to the present disclosure to the image pickup unit 11402, the image pickup unit 11402 can be downsized.

Note that, in this example, the endoscopic surgery system has been described as an example, however, the technology according to the present disclosure may be applied to other systems such as a microscopic surgery system.

Note that the configuration of the second embodiment of the present disclosure can be applied to other embodiments. Specifically, the recesses 151 having a band shape in FIG. 11 can be arranged in the regions excluding the regions 159 immediately below the element regions 260 in the second semiconductor substrate 220 described in FIG. 7.

Note that the above-described embodiments illustrate examples in which the present technology is applied to an imaging device that performs imaging of visible light. The present technology can be applied to other elements and devices. For example, the present technology can be applied to an imaging element that performs imaging of infrared light. Furthermore, for example, the present technology can also be applied to a ranging sensor that measures a distance to an object. The present technology can also be applied to a semiconductor element obtained by stacking a plurality of semiconductor substrates other than the above.

(Effects)

The imaging element (imaging device 1) includes the first semiconductor substrate 120, the second semiconductor substrate 220, the insulating layer 141, the connection sections 251, and the recess 151. The first semiconductor substrate 120 includes photoelectric conversion sections 101 that perform photoelectric conversion of incident light. The second semiconductor substrate 220 includes pixel circuits that generate an image signal corresponding to a charge generated by the photoelectric conversion, and the first semiconductor substrate 120 is stacked on the back side of the second semiconductor substrate 220. The insulating layer 141 is disposed between the first semiconductor substrate 120 and the second semiconductor substrate 220. A connection section 251 penetrates through the insulating layer 141 and connects the first semiconductor substrate 120 and the back side of the second semiconductor substrate 220. The recess 151 is disposed on a surface of the insulating layer 141 adjacent to the second semiconductor substrate 220 and is formed around the connection sections 251. As a result, the connection sections 251 can be formed in protruding shapes on the bottom surface of the recess 151. When the first semiconductor substrate 120 and the second semiconductor substrate 220 are stacked, the ends of the connection sections 251 and the second semiconductor substrate 220 can be brought into contact with each other.

In addition, the connection sections 251 may make reference potentials, of the first semiconductor substrate 120 and the second semiconductor substrate to be connected, common to each other. As a result, the reference potential can be supplied by the connection sections 251.

In addition, a gap 150 may be formed between the recess 151 and the back side of the second semiconductor substrate 220.

Furthermore, the gap 150 may be a vacuum. As a result, it is possible to prevent damage in a manufacturing step involving heating at the time of manufacturing the imaging element.

In addition, the recess 151 may be formed in the insulating layer 141 in a region different from a region immediately below elements formed in the second semiconductor substrate 220. This makes it possible to prevent a decrease in the strength of the element.

In addition, wiring disposed in the insulating layer 141 and connected to the first semiconductor substrate 120 may be further included, and the recess 151 may be formed in the insulating layer 141 in a region different from the region where the wiring is disposed. This makes it possible to prevent a decrease in the insulation performance of the insulating layer 141 in the wiring 142.

Moreover, the recess 151 may be formed in common around the plurality of connection sections 251. As a result, the recess 151 having a large area can be formed.

Alternatively, the recess 151 may be formed in a band shape.

Furthermore, the recess 151 may have a depth deeper than or equal to 5 nm. This makes it possible to secure a margin for variations in the manufacturing process.

Furthermore, the connection sections 251 may have a height greater than or equal to 5 nm from the bottom surface of the recess 151. This makes it possible to secure a margin for variations in the height of the connection section 251.

Furthermore, the connection sections 251 may contain silicon. This makes it possible to apply a high-temperature process.

Furthermore, the insulating layer 141 may be made of an oxide.

In addition, the second semiconductor substrate 220 may include a semiconductor region 123 having a high impurity concentration to which the connection sections 251 are connected. As a result, the connection resistance can be reduced.

The imaging device 1 includes the first semiconductor substrate 120, the second semiconductor substrate 220, the insulating layer 141, the connection sections 251, the recess 151, and the column signal processing section 550. The first semiconductor substrate 120 includes photoelectric conversion sections 101 that perform photoelectric conversion of incident light. The second semiconductor substrate 220 includes pixel circuits that generate an image signal corresponding to a charge generated by the photoelectric conversion, and the first semiconductor substrate 120 is stacked on the back side of the second semiconductor substrate 220. The insulating layer 141 is disposed between the first semiconductor substrate 120 and the second semiconductor substrate 220. A connection section 251 penetrates through the insulating layer 141 and connects the first semiconductor substrate 120 and the back side of the second semiconductor substrate 220. The recess 151 is disposed on a surface of the insulating layer 141 adjacent to the second semiconductor substrate 220 and is formed around the connection sections 251. The column signal processing section 550 processes image signals that are generated. When the first semiconductor substrate 120 and the second semiconductor substrate 220 are stacked, the ends of the connection sections 251 and the second semiconductor substrate 220 can be brought into contact with each other.

Note that the effects described herein are merely examples and are not limited, and other effects may also be achieved.

Note that the present technology can also have the following configurations.

(1)

An imaging element comprising:

a first semiconductor substrate including a photoelectric conversion section that performs photoelectric conversion of incident light;

a second semiconductor substrate including a pixel circuit that generates an image signal corresponding to a charge generated by the photoelectric conversion, the second semiconductor substrate stacked with the first semiconductor substrate on a back side of the second semiconductor substrate;

an insulating layer disposed between the first semiconductor substrate and the second semiconductor substrate;

a connection section penetrating through the insulating layer and connecting the first semiconductor substrate and the back side of the second semiconductor substrate; and a recess disposed on a surface of the insulating layer adjacent to the second semiconductor substrate, the recess formed around the connection section.

(2)

The imaging element according to the above (1), wherein the connection section makes reference potentials of the first semiconductor substrate and the second semiconductor substrate common.

(3)

The imaging element according to the above (1) or (2), wherein the recess forms a gap with the back side of the second semiconductor substrate.

(4)

The imaging element according to the above (3), wherein the gap is a vacuum.

(5)

The imaging element according to any one of the above (1) to (4), wherein the recess is formed in the insulating layer in a region different from a region immediately below an element formed in the second semiconductor substrate.

(6)

The imaging element according to any one of the above (1) to (5), further comprising:

wiring disposed in the insulating layer and connected to the first semiconductor substrate, wherein the recess is formed in the insulating layer in a region different from a region in which the wiring is disposed.

(7)

The imaging element according to any one of the above (1) to (6), wherein the recess is formed in common around a plurality of the connection sections.

(8)

The imaging element according to the above (7), wherein the recess is formed in a band shape.

(9)

The imaging element according to any one of the above (1) to (8), wherein the recess has a depth deeper than or equal to 5 nm.

(10)

The imaging element according to any one of the above (1) to (9), wherein the connection section has a height greater than or equal to 5 nm from a bottom surface of the recess.

(11)

The imaging element according to any one of the above (1) to (10), wherein the connection section contains silicon.

(12)

The imaging element according to any one of the above (1) to (11), wherein the insulating layer is made of an oxide.

(13)

The imaging element according to any one of the above (1) to (12), wherein the second semiconductor substrate includes a semiconductor region having a high impurity concentration to which the connection section is connected.

(14)

The imaging element according to any one of the above (1) to (13), further comprising:

a pad disposed adjacent to the first semiconductor substrate, wherein the connection section is connected to the first semiconductor substrate via the pad.

(15)

The imaging element according to the above (14), further comprising a semiconductor region formed by diffusion of an impurity contained in the pad into the first semiconductor substrate.

(16)

The imaging element according to any one of the above (1) to (15), wherein the pixel circuit includes a FinFET.

(17)

An imaging device comprising:

a first semiconductor substrate including a photoelectric conversion section that performs photoelectric conversion of incident light;

a second semiconductor substrate including a pixel circuit that generates an image signal corresponding to a charge generated by the photoelectric conversion, the second semiconductor substrate stacked with the first semiconductor substrate on a back side of the second semiconductor substrate;

an insulating layer disposed between the first semiconductor substrate and the second semiconductor substrate;

a connection section penetrating through the insulating layer and connecting the first semiconductor substrate and the back side of the second semiconductor substrate;

a recess disposed on a surface of the insulating layer adjacent to the second semiconductor substrate, the recess formed around the connection section; and a processing circuit that processes the image signal that has been generated.

REFERENCE SIGNS LIST

1 IMAGING DEVICE
100 FIRST SUBSTRATE
100S, 200S, 300S SEMICONDUCTOR LAYER
100T, 200T, 300T WIRING LAYER
101, 101A, 101B, 101C, 101D PHOTOELECTRIC CONVERSION SECTION
102, 102A, 102B, 102C, 102D CHARGE TRANSFER SECTION
103, 103A, 103B, 103C, 103D CHARGE HOLDING SECTION
120 FIRST SEMICONDUCTOR SUBSTRATE
121A, 121B, 122A, 122B, 123, 123A, 221, 222, 227, 228, 321 SEMICONDUCTOR REGION
132, 133 PAD
141, 241, 341 INSULATING LAYER
142, 242, 342 WIRING
143, 244, 344 CONTACT PLUG
150 GAP
151 RECESS
158, 159 REGION
200 SECOND SUBSTRATE
210 PIXEL CIRCUIT
220 SECOND SEMICONDUCTOR SUBSTRATE
213 AMPLIFICATION TRANSISTOR
251 CONNECTION SECTION
252, 253, 253A, 253B THROUGH ELECTRODE
260 ELEMENT REGION

300 THIRD SUBSTRATE
320 THIRD SEMICONDUCTOR SUBSTRATE
540 PIXEL ARRAY SECTION
541, 541A, 541B, 541C, 541D PIXEL
550 COLUMN SIGNAL PROCESSING SECTION
11402, 12031, 12101 to 12105 IMAGE PICKUP UNIT/IMAGING SECTION

The invention claimed is:

1. An imaging element, comprising:
a first semiconductor substrate including a photoelectric conversion section configured to perform photoelectric conversion of incident light to generate a charge;
a second semiconductor substrate including a pixel circuit configured to generate an image signal corresponding to the charge generated by the photoelectric conversion, the second semiconductor substrate stacked with the first semiconductor substrate on a back side of the second semiconductor substrate;
an insulating layer between the first semiconductor substrate and the second semiconductor substrate;
a connection section penetrating through the insulating layer and connecting the first semiconductor substrate and the back side of the second semiconductor substrate, wherein
the second semiconductor substrate further includes a first semiconductor region connected to the connection section, and
the first semiconductor region has a higher impurity concentration than that of a region of the second semiconductor substrate; and
a recess on a surface of the insulating layer, wherein
the surface of the insulating layer is adjacent to the second semiconductor substrate, and
the recess is around the connection section.

2. The imaging element according to claim 1, wherein the connection section is configured to make reference potentials of the first semiconductor substrate and the second semiconductor substrate common.

3. The imaging element according to claim 1, wherein the recess forms a gap with the back side of the second semiconductor substrate.

4. The imaging element according to claim 3, wherein the gap is a vacuum.

5. The imaging element according to claim 1, wherein
the recess is in a first region of the insulating layer,
the first region of the insulating layer is different from a second region of the insulating layer, and
the second region of the insulating layer is immediately below an element in the second semiconductor substrate.

6. The imaging element according to claim 1, further comprising a wiring in a first region of the insulating layer and connected to the first semiconductor substrate, wherein
the recess is in a second region of the insulating layer, and
the first region of the insulating layer is different from the second region of the insulating layer.

7. The imaging element according to claim 1, further comprising a plurality of connection sections including the connection section,
wherein the recess is a common recess around the plurality of connection sections.

8. The imaging element according to claim 7, wherein the recess has band shape.

9. The imaging element according to claim 1, wherein the recess has a depth deeper than or equal to 5 nm.

10. The imaging element according to claim 1, wherein the connection section has a height greater than or equal to 5 nm from a bottom surface of the recess.

11. The imaging element according to claim 1, wherein the connection section contains silicon.

12. The imaging element according to claim 1, wherein the insulating layer comprises an oxide.

13. The imaging element according to claim 1, further comprising a pad adjacent to the first semiconductor substrate,
wherein the connection section is connected to the first semiconductor substrate via the pad.

14. The imaging element according to claim 13, further comprising a second semiconductor region in the first semiconductor substrate,
wherein the second semiconductor region comprises a diffused impurity from the pad.

15. The imaging element according to claim 1, wherein the pixel circuit includes a FinFET.

16. An imaging device, comprising:
a first semiconductor substrate including a photoelectric conversion section configured to perform photoelectric conversion of incident light to generate a charge;
a second semiconductor substrate including a pixel circuit configured to generate an image signal corresponding to the charge generated by the photoelectric conversion, the second semiconductor substrate stacked with the first semiconductor substrate on a back side of the second semiconductor substrate;
an insulating layer between the first semiconductor substrate and the second semiconductor substrate;
a connection section penetrating through the insulating layer and connecting the first semiconductor substrate and the back side of the second semiconductor substrate, wherein
the second semiconductor substrate further includes a first semiconductor region connected to the connection section, and
the first semiconductor region has a higher impurity concentration than that of a region of the second semiconductor substrate;
a recess on a surface of the insulating layer, wherein
the surface of the insulating layer is adjacent to the second semiconductor substrate, and
the recess is around the connection section; and
a processing circuit configured to process the image signal.

* * * * *